(12) United States Patent
Leigh et al.

(10) Patent No.: US 10,874,032 B2
(45) Date of Patent: Dec. 22, 2020

(54) ROTATABLE COLD PLATE ASSEMBLY FOR COOLING PLUGGABLE MODULES

(71) Applicant: HEWLETT PACKARD ENTERPRISE DEVELOPMENT LP, Houston, TX (US)

(72) Inventors: Kevin B. Leigh, Houston, TX (US); John Norton, Houston, TX (US); Sunil Ganta, Cypress, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/397,414

(22) Filed: Apr. 29, 2019

(65) Prior Publication Data
US 2020/0260615 A1    Aug. 13, 2020

Related U.S. Application Data

(63) Continuation-in-part of application No. 16/175,977, filed on Oct. 31, 2018, now Pat. No. 10,539,753.

(51) Int. Cl.
*H05K 7/20*    (2006.01)
*H05K 7/14*    (2006.01)
(Continued)

(52) U.S. Cl.
CPC .......... *H05K 7/20636* (2013.01); *G06F 1/20* (2013.01); *H01L 23/427* (2013.01);
(Continued)

(58) Field of Classification Search
CPC ............. H05K 7/20636; H05K 7/1427; H05K 7/20645; G06F 1/20; G06F 2200/201; H01L 23/427; H01L 23/473
(Continued)

(56) References Cited

U.S. PATENT DOCUMENTS 3,735,206 A * 5/1973 Pesek .................. H05K 7/1461
361/721
5,473,506 A    12/1995 Kikinis
(Continued)

OTHER PUBLICATIONS

ASUS USA, "Intel Z270 EATX gaming motherboard with water-cooling monoblock, dual M.2, Aura Sync RGB LEDs, DDR4 4133MHz, Thunderbolt 3, 802.11ac Wi-Fi, and USB 3.1 Type-A/C," 2018, pp. 1-37 (online), Retrieved from the Internet on May 29, 2018 at URL: <asus.com/us/Motherboards/ROG-MAXIMUS-IX-EXTREME/>.

(Continued)

*Primary Examiner* — Anatoly Vortman
(74) *Attorney, Agent, or Firm* — Nolte Intellectual Property Law

(57) ABSTRACT

An example computing device includes one or more bays to receive a pluggable module, and a cold plate assembly. The cold plate assembly includes one or more cold plates to engage with the pluggable modules and transfer heat from the modules to liquid coolant. The cold plate assembly also includes a pivoting support that supports the cold plate(s) and pivots relative to the system board, and an engagement mechanism comprising a mechanical linkage with mechanical advantage attached to the pivoting support such that moving a link of the mechanical linkage causes the pivoting support to pivot between an engaged position and a disengaged position. In the engaged position, the cold plate contacts is positioned to engaged with the pluggable module, while in the disengaged position the cold plate is disengaged from the pluggable module.

14 Claims, 19 Drawing Sheets

(51) Int. Cl.
*G06F 1/20* (2006.01)
*H01L 23/473* (2006.01)
*H01L 23/427* (2006.01)

(52) U.S. Cl.
CPC ......... *H01L 23/473* (2013.01); *H05K 7/1427* (2013.01); *H05K 7/20645* (2013.01); *G06F 2200/201* (2013.01)

(58) Field of Classification Search
USPC ........................................................ 361/702
See application file for complete search history.

(56) References Cited

U.S. PATENT DOCUMENTS

| | | | | |
|---|---|---|---|---|
| 6,219,241 B1 * | 4/2001 | Jones | .................. | H05K 7/1007 |
| | | | | 361/704 |
| 6,269,001 B1 | 7/2001 | Matteson et al. | | |
| 6,393,853 B1 | 5/2002 | Vukovic et al. | | |
| 6,410,850 B1 | 6/2002 | Abel et al. | | |
| 7,212,409 B1 * | 5/2007 | Belady | ...................... | G06F 1/20 |
| | | | | 361/721 |
| 7,372,702 B2 | 5/2008 | Gauche et al. | | |
| 7,420,808 B2 | 9/2008 | Campbell et al. | | |
| 7,529,094 B2 * | 5/2009 | Miller | .................. | G02B 6/4246 |
| | | | | 165/185 |
| 7,580,259 B2 * | 8/2009 | Hsiao | ........................ | G06F 1/20 |
| | | | | 361/679.48 |
| 7,626,820 B1 | 12/2009 | Konshak et al. | | |
| 7,764,504 B2 * | 7/2010 | Phillips | ................ | G02B 6/4246 |
| | | | | 165/80.2 |
| 7,869,215 B2 | 1/2011 | Hung et al. | | |
| 7,961,465 B2 | 6/2011 | Goldrian et al. | | |
| 7,974,098 B2 * | 7/2011 | Oki | ...................... | G02B 6/4201 |
| | | | | 165/185 |
| 8,000,103 B2 * | 8/2011 | Lipp | .................. | F28D 1/05316 |
| | | | | 165/104.33 |
| 8,223,498 B2 * | 7/2012 | Lima | .................. | H05K 7/20418 |
| | | | | 361/704 |
| 8,345,445 B2 * | 1/2013 | Del Prete | .................. | G06F 1/20 |
| | | | | 165/185 |
| 8,535,787 B1 * | 9/2013 | Lima | ......................... | B32B 7/12 |
| | | | | 165/185 |
| 8,755,179 B2 | 6/2014 | Alyaser et al. | | |
| 8,760,870 B2 * | 6/2014 | Yamamoto | ........... | G02B 6/4201 |
| | | | | 165/80.2 |
| 8,911,244 B2 * | 12/2014 | Elison | ................ | H05K 7/20409 |
| | | | | 439/137 |
| 8,947,881 B2 * | 2/2015 | Aspas Puertolas | .. | H05K 7/2049 |
| | | | | 165/185 |
| 9,144,178 B2 * | 9/2015 | Arvelo | ............... | H05K 7/20772 |
| 9,158,348 B2 | 10/2015 | Berk et al. | | |
| 9,852,963 B2 | 12/2017 | Shedd et al. | | |
| 9,900,101 B2 | 2/2018 | Leigh et al. | | |
| 10,468,794 B2 * | 11/2019 | Leigh | ................... | G02B 6/4246 |
| 10,548,245 B2 * | 1/2020 | Lipp | ................... | H05K 7/20836 |
| 2003/0141090 A1 * | 7/2003 | Kruger | .................. | G02B 6/4201 |
| | | | | 174/50 |
| 2003/0161108 A1 * | 8/2003 | Bright | ...................... | G02B 6/4277 |
| | | | | 361/707 |
| 2004/0203289 A1 * | 10/2004 | Ice | ...................... | H01R 13/6596 |
| | | | | 439/607.2 |
| 2004/0252453 A1 * | 12/2004 | Brooks | .............. | H05K 7/20718 |
| | | | | 361/679.51 |
| 2005/0186816 A1 * | 8/2005 | Franz | ............... | H01R 13/62933 |
| | | | | 439/157 |
| 2009/0296350 A1 * | 12/2009 | Oki | ....................... | G02B 6/4284 |
| | | | | 361/709 |
| 2009/0296351 A1 * | 12/2009 | Oki | ....................... | G02B 6/4246 |
| | | | | 361/709 |
| 2015/0160702 A1 | 6/2015 | Franz et al. | | |
| 2017/0027083 A1 * | 1/2017 | Bai | ...................... | H05K 7/20672 |
| 2017/0142864 A1 | 5/2017 | Chanu et al. | | |
| 2017/0164518 A1 | 6/2017 | Morgan et al. | | |

OTHER PUBLICATIONS

Electronics Cooling, "Pluggable Optics Modules—Thermal Specifications, Part 1," Jul. 7, 2016, pp. 1-12 (online), Retrieved from the Internet on Feb. 14, 2019 at URL: <electronics-cooling.com/2016/07/pluggable-optics-rnodules-thermal-specifications-part-1/>.

\* cited by examiner

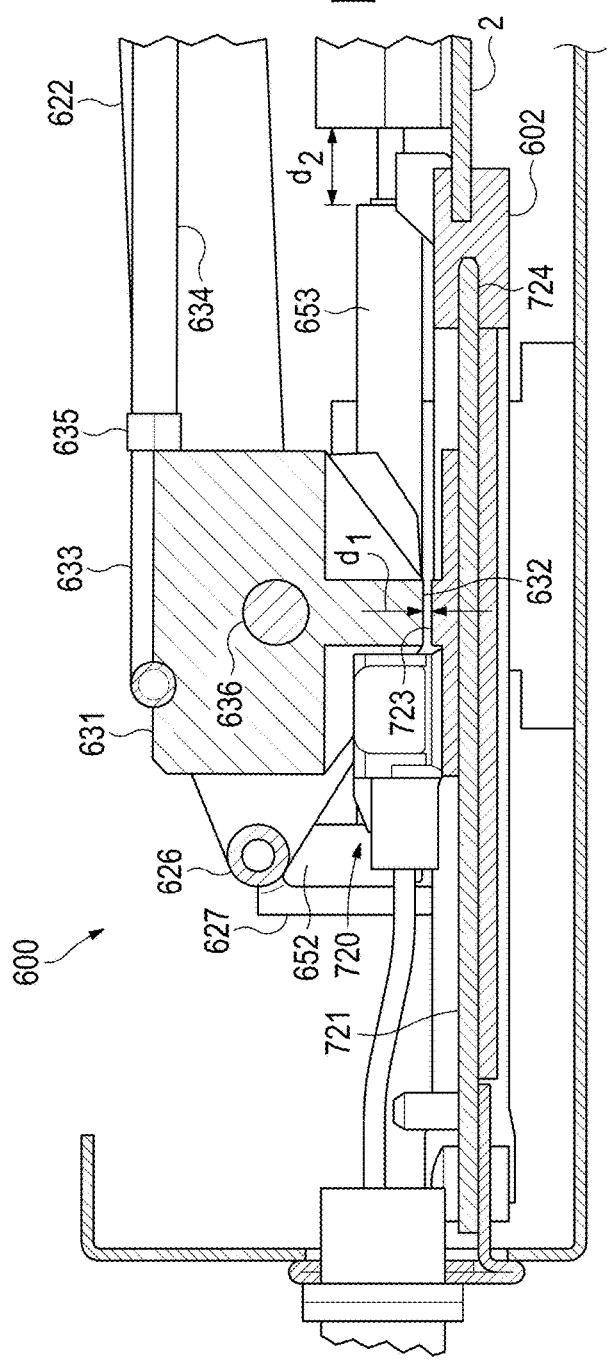
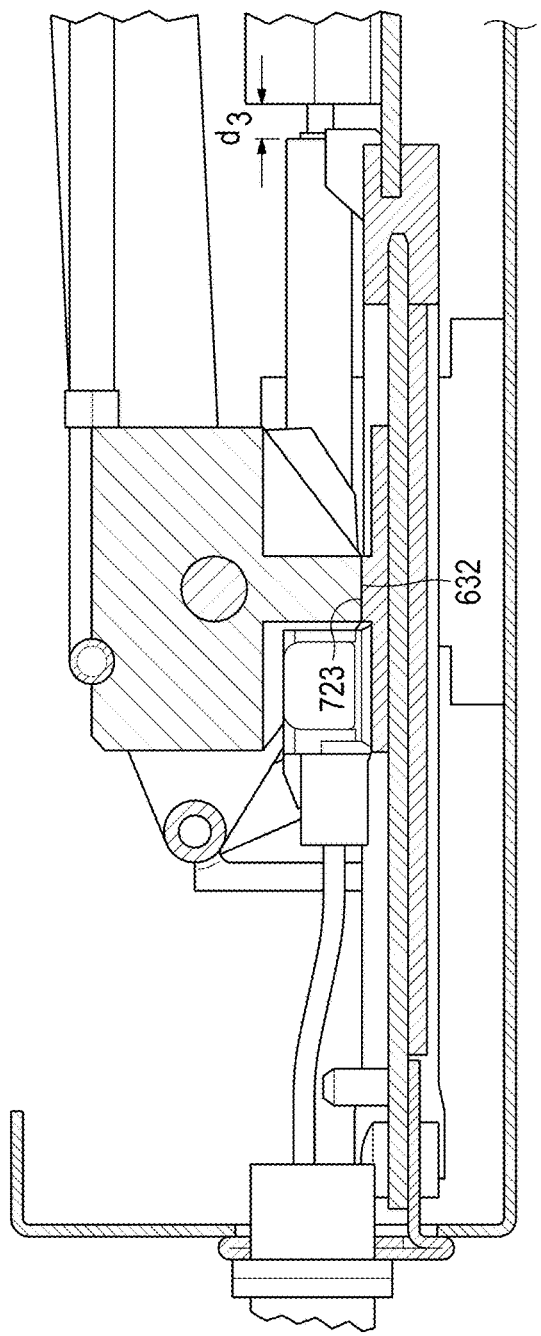

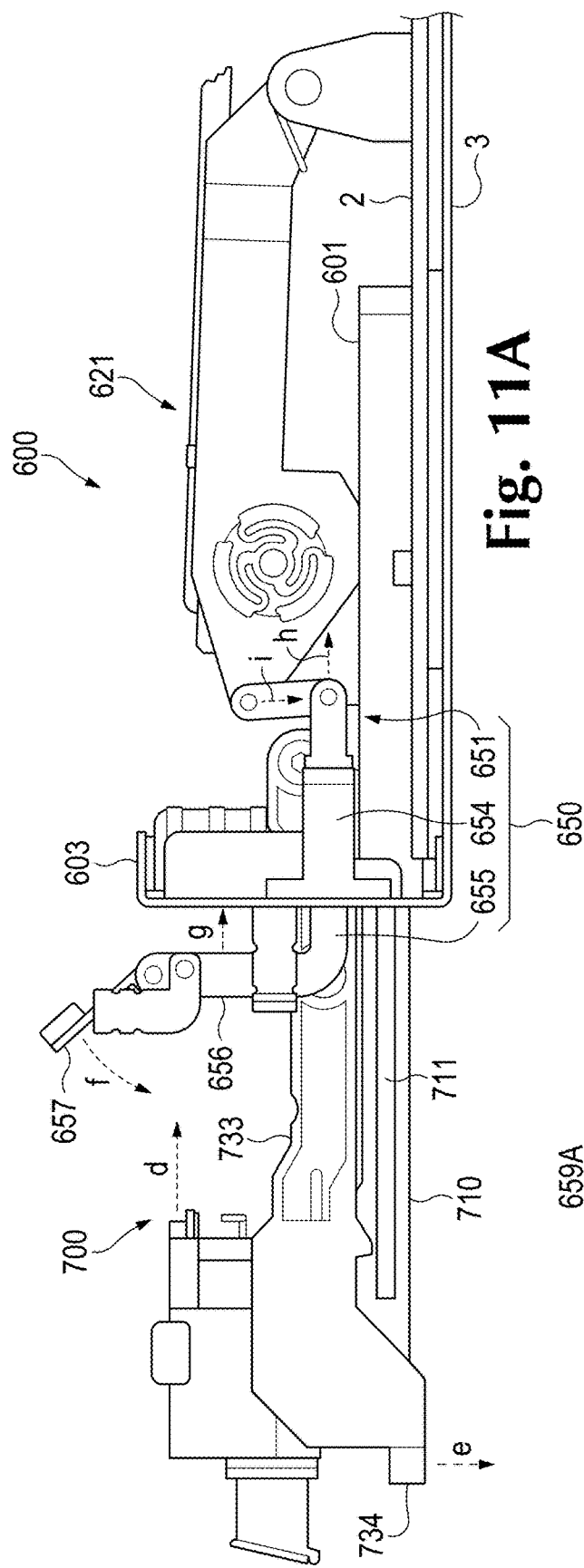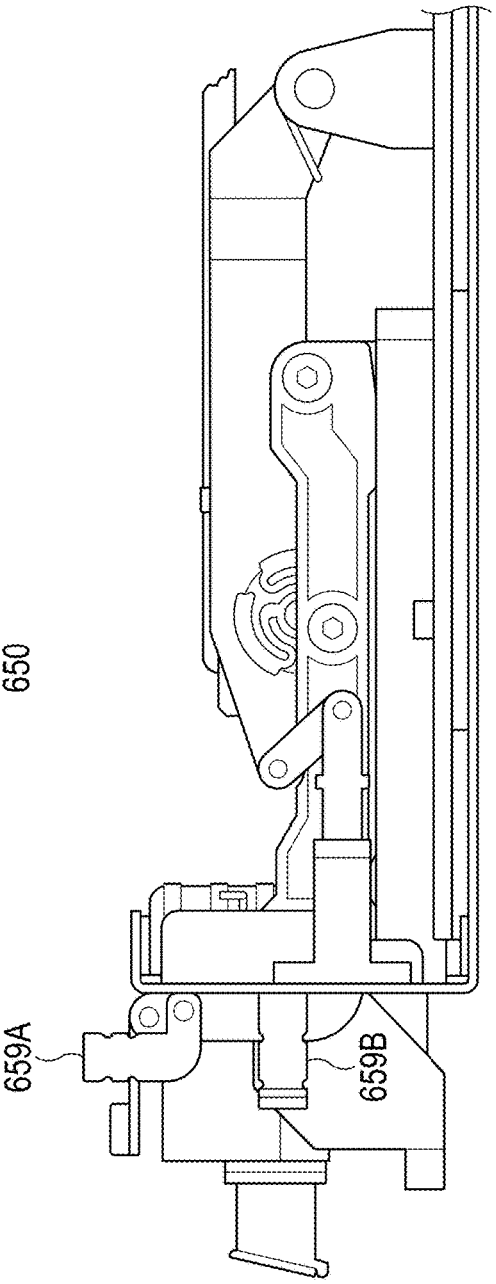

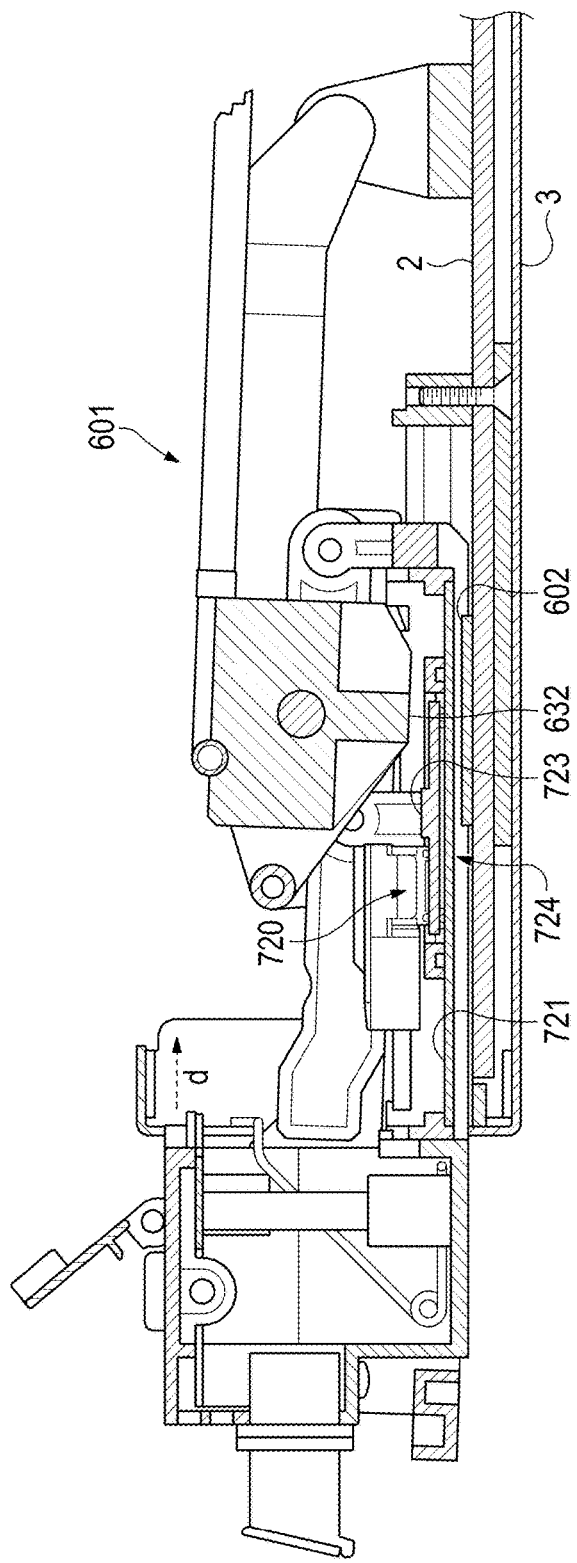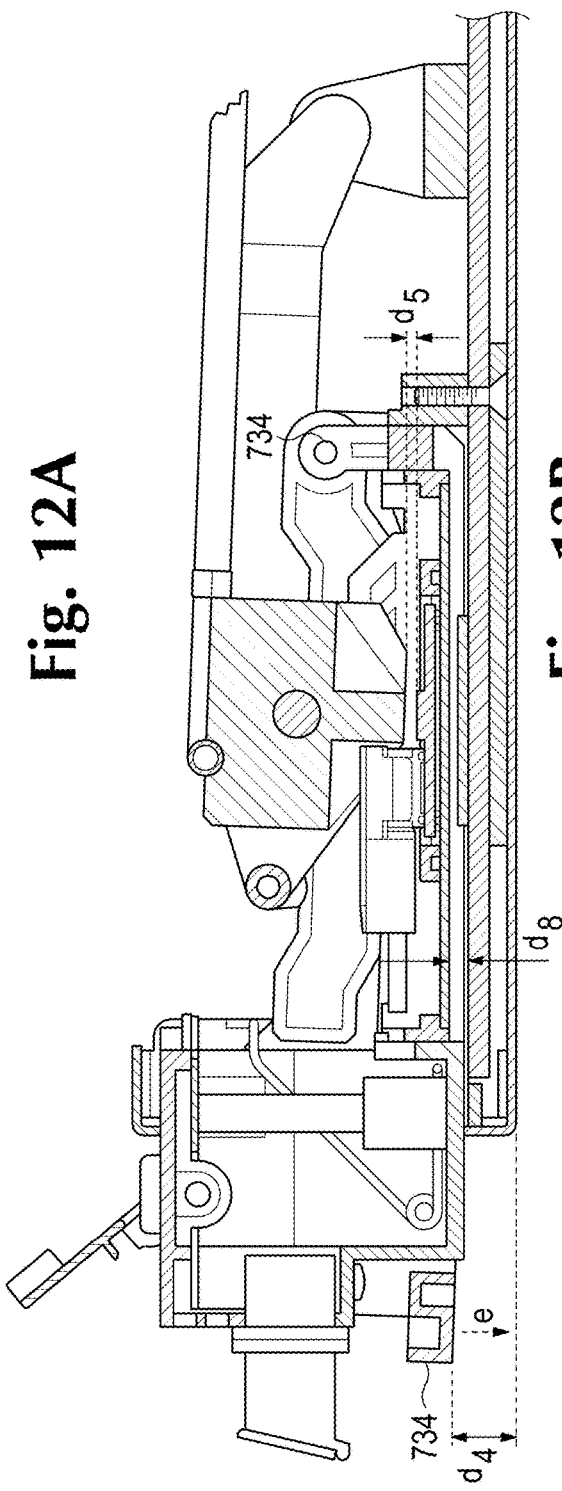

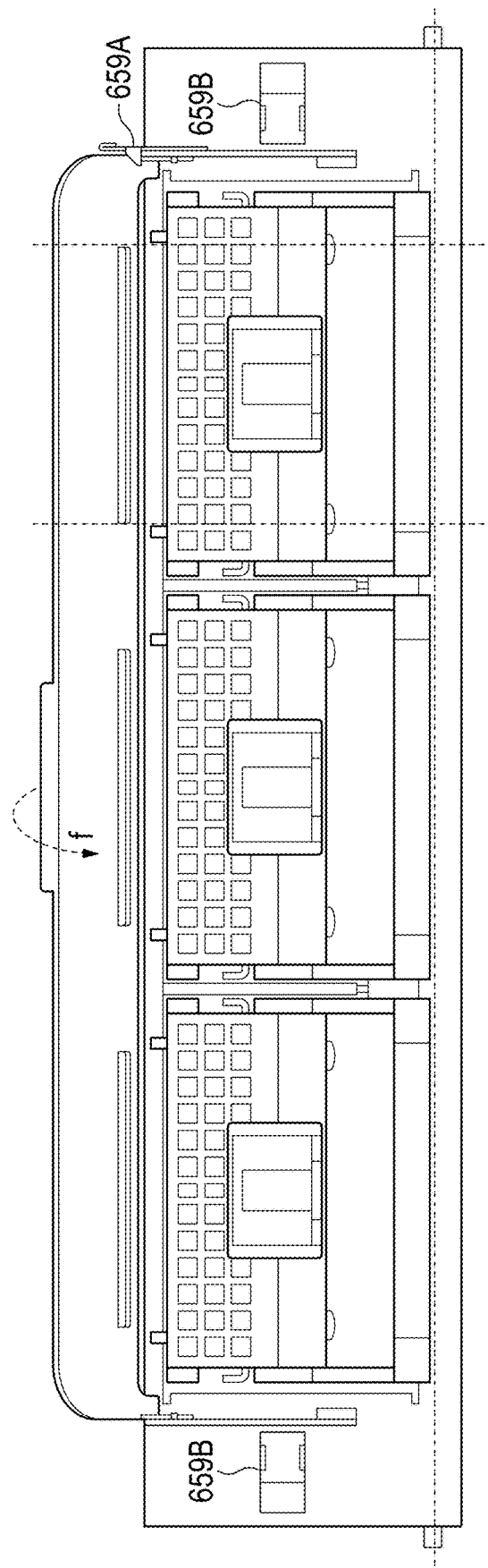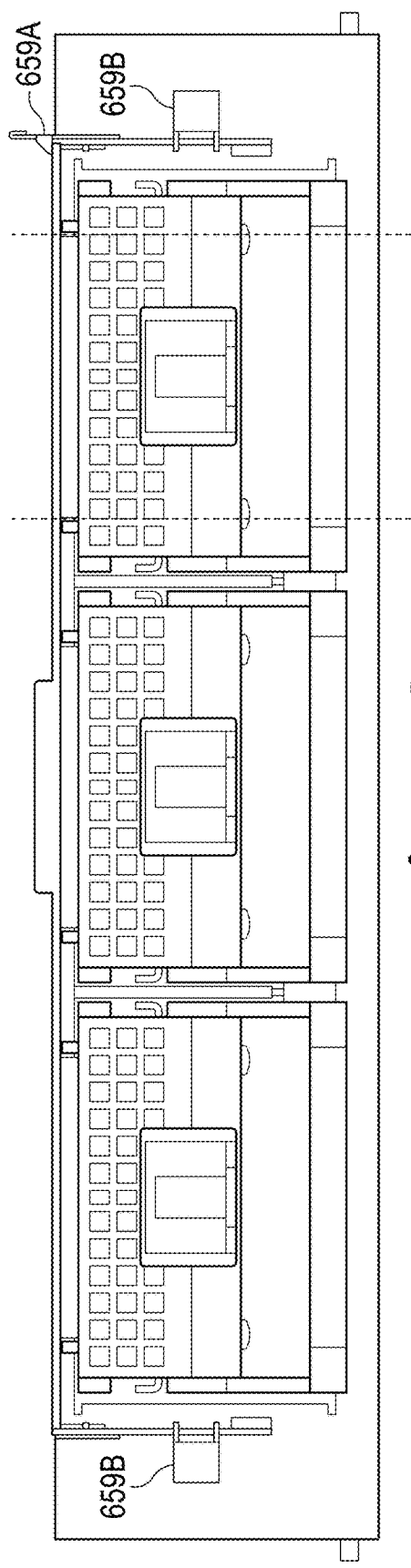

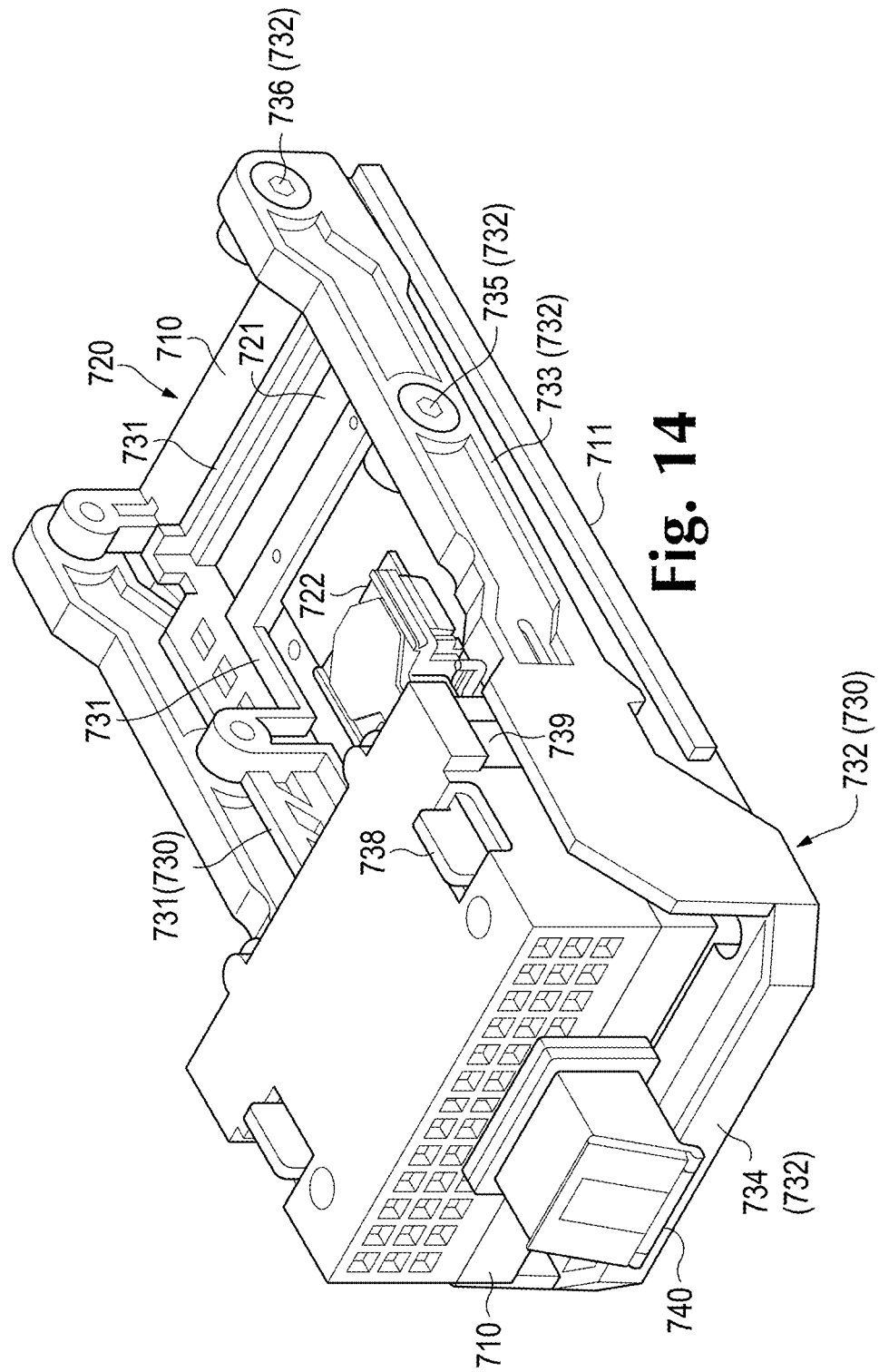

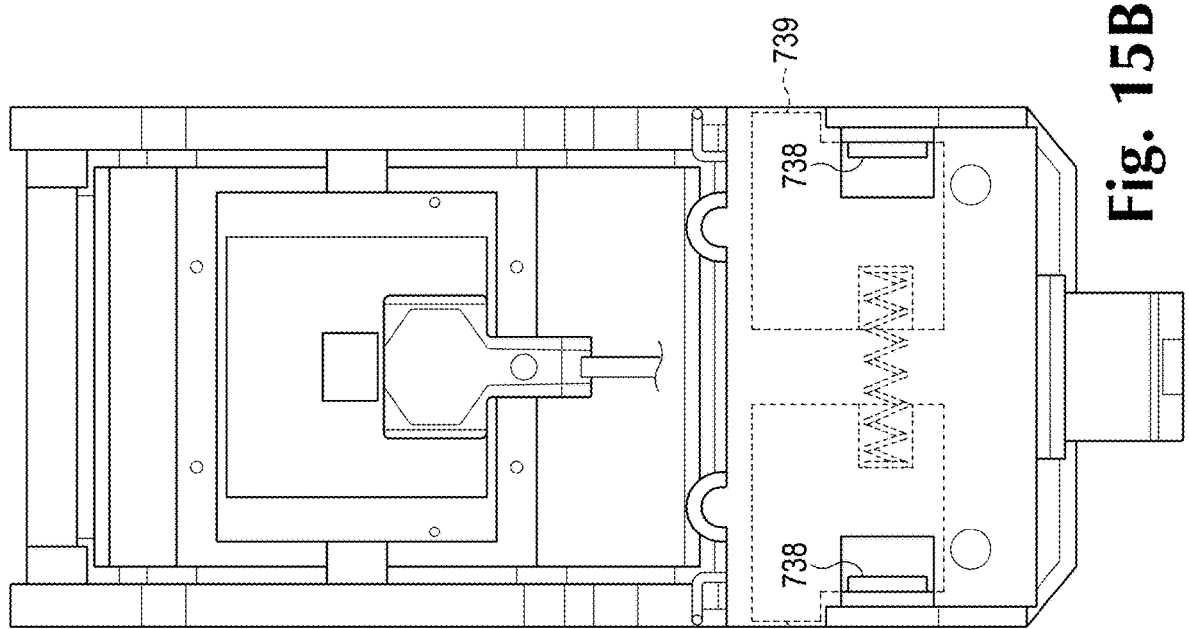
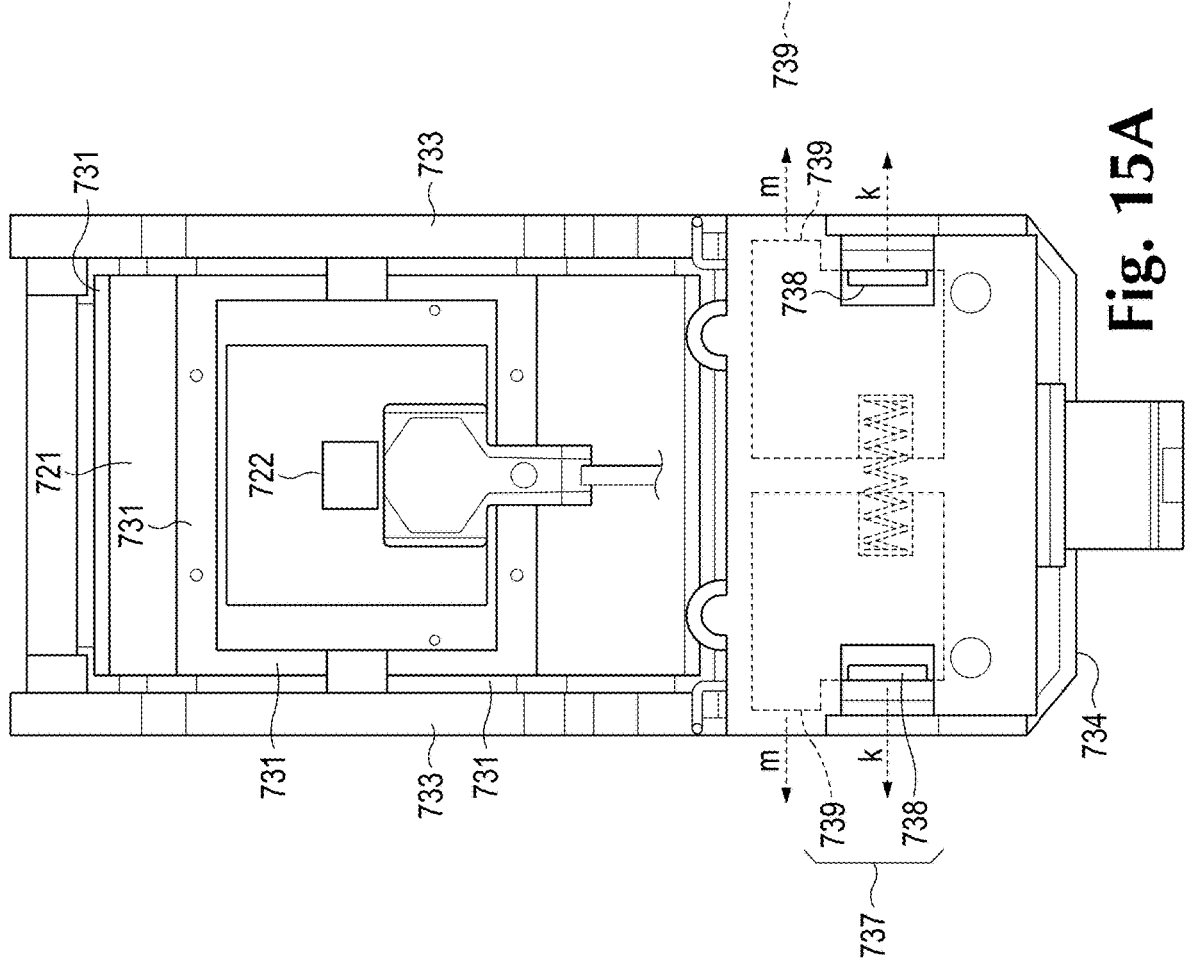

ROTATABLE COLD PLATE ASSEMBLY FOR COOLING PLUGGABLE MODULES

CROSS REFERENCE TO RELATED APPLICATIONS

This application is a continuation-in-part of co-pending U.S. patent application Ser. No. 16/175977, filed on 31 Oct. 2018, the contents of which are incorporated herein by reference in their entirety.

BACKGROUND

Computing systems include components that generate heat when in usage. The generated heat can damage components and/or impair their performance, and therefore cooling systems are employed to remove the heat from the computing system and cool the components.

Some computing components (hereinafter "pluggable modules"), are designed to be easily plugged into and removed from a system by a user during normal usage. Such pluggable modules generally include features to enable easy installation/removal, such as blind-mate electrical connectors that allow the module to be electrically connected into the system without the user needing to directly observe/control the mating of the electrical connectors. Some pluggable modules are hot-pluggable, meaning they can be plugged into or removed from a system while the system is running without requiring a system restart. Examples of pluggable modules include electro-optical transceiver modules (e.g., C form-factor pluggable (CFP) modules, Small form-factor pluggable (SFP) modules, Quad small form-factor (QSFP) modules, etc.), switch modules, solid state drives (SSDs), hard disk drives (HDDs), and so on. Pluggable modules, like any other computing components, generate heat, and thus may need some form of cooling system to remove the heat.

BRIEF DESCRIPTION OF THE DRAWINGS

The figures illustrate certain aspects of examples of the subject matter of this disclosure, but should not be viewed as exclusive or exhaustive examples.

FIG. 3A illustrates the computing device before the pluggable module is received in the bay. FIG. 3B illustrates the computing device when the pluggable module has been received in the bay, but before the cold plate assembly is engaged with the module. FIG. 3C illustrates the computing device after the cold plate assembly is engaged with the module.

FIG. 4A illustrates the computing device before the pluggable module is received in the bay. FIG. 4B illustrates the computing device when the pluggable module has been received in the bay, but before the cold plate assembly is engaged with the module. FIG. 4C illustrates the computing device after the cold plate assembly is engaged with the module.

FIGS. 5A-B are plan cross-sectional views of the example computing device of FIG. 1 that illustrate the sequence of events illustrated in FIGS. 3B-C. The cross-section is taken along the line A-A. FIG. 5A illustrates the computing device when the pluggable module has been received in the bay, but before the cold plate assembly is engaged with the module. FIG. 5B illustrates the computing device after the cold plate assembly is engaged with the module.

FIG. 6A illustrates the computing device when the pluggable module has been received in the bay, but before the cold plate assembly is engaged with the module. FIG. 6B illustrates the computing device after the cold plate assembly is engaged with the module.

FIGS. 11A-B are side plan views of the example computing device of FIG. 9 that illustrate a sequence of events associated with installing a pluggable module in a bay. FIG. 11A illustrates the computing device prior to the pluggable module being fully inserted into the bay. FIG. 11B illustrates the computing device when the pluggable module has been installed in the bay and the cold plate assembly has been engaged with the pluggable module.

FIGS. 12A-D are cross-sectional views of the example computing device of FIG. 9 that illustrate a sequence of events associated with installing a pluggable module in a bay. FIG. 12A illustrates the computing device prior to the pluggable module being fully inserted into the bay. FIG. 12B illustrates the computing device when the pluggable module has been fully inserted into the bay. FIG. 12C illustrates the computing device when an electronic engagement lever has been actuated to electrically connect the pluggable module to the computing device. FIG. 12D illustrates the computing device when the cold plate assembly has been engaged with the pluggable module.

FIGS. 13A-C are front plan views of the example computing device of FIG. 9 that illustrate a sequence of events associated with installing a pluggable module in a bay. FIG. 12A illustrates the computing device when the pluggable module has been fully inserted into the bay. FIG. 12B illustrates the computing device when an electronic engagement lever has been actuated to electrically connect the pluggable module to the computing device. FIG. 12D illustrates the computing device when a lever has been actuated to engage the cold plate assembly with the pluggable module.

FIG. 14 is a perspective view of an example pluggable module.

FIGS. 15A-B are top plan views of the example pluggable module of FIG. 14. FIG. 15A illustrates the pluggable module when the electrical engagement lever is not engaged. FIG. 15B illustrates the pluggable module when the electrical engagement lever is engaged

In the figures, elements and steps denoted by the same reference numerals are associated with the same or similar elements and steps, unless indicated otherwise.

DETAILED DESCRIPTION

Figure 1:
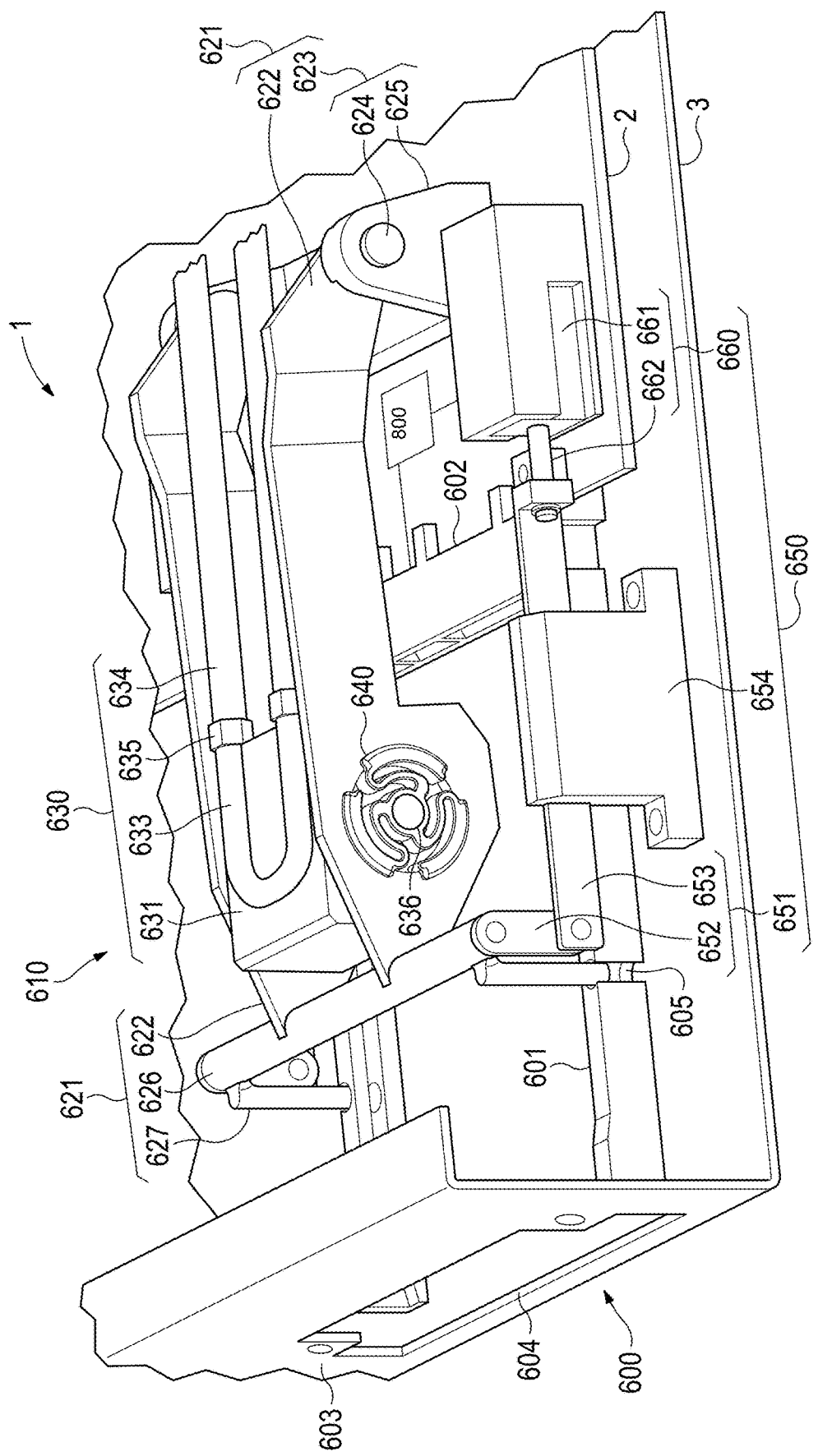
FIG. 1 is a perspective view of an example computing device with a cold plate assembly that has an electronic actuator.

One approach to cooling a computing system is to force air to flow over/around the components or a heat sink that is thermally coupled to the components. In many systems, this air-cooling approach is used to cool the pluggable modules.

However, in some systems air cooling of pluggable modules is suboptimal. In particular, in some systems air is not capable of sufficiently cooling the pluggable modules to the extent desired, at least not without having to compromise on some other desired parameters (e.g., size of the computing device, fan speed and power usage, etc.). This is partly due to the fact that some pluggable modules, such as electro-optical transceivers, use a lot of power and generate a lot of heat. In addition, in some systems certain pluggable modules are disposed in locations that do not receive enough air, or that receive air that is too warm because it has already cooled (i.e., extracted heat from) other components. For example, electro-optical transceiver modules are often relegated to the back of the chassis, which usually receives air that has been pre-heated by components situated upstream in the chassis, such as high-power processor and memory devices.

Thus, disclosed herein are example systems that use liquid cooling, rather than forced-air cooling, to cool pluggable modules. Liquid cooling (sometimes called direct liquid cooling, or DLC) involves flowing liquid coolant (e.g., water) through a cooling loop in a computing system and thermally coupling the liquid coolant to the components that need to be cooled, so that heat generated by the components is transferred into the liquid coolant and carried out of the computing system. The liquid coolant is thermally coupled to the components that need cooling by a device called a cold plate. The cold plate is thermally conductive and is either (a) in direct contact with the liquid coolant (e.g., the liquid flows through an interior channel within the cold plate), or (b) in contact with a pipe or tube that carriers the liquid coolant. The cold plate is also thermally coupled to the component that needs cooling. Thus, heat generated by the component is conducted into the cold plate, and from the cold plate it is conducted into the liquid coolant.

Although liquid cooling is, in general, a viable alternative to air-based cooling, the context of pluggable modules poses some special difficulties for liquid cooling that may not be encountered when cooling other components. In particular, the fact that pluggable modules are intended to be easily added to and removed from the system by a user post-manufacture, means that a liquid cooling loop of the system cannot be directly affixed to the pluggable modules in the same way that it would be to a more permanent fixture of the system (like a processor).

One approach to enabling liquid cooling for pluggable modules is to have the cold plate be a permanent part of the module together with liquid couplings that enable the cold plate to be coupled to or decoupled from a liquid cooling loop of the system when the pluggable module is installed or removed. However, if the liquid couplings are manual liquid couplings, the user would have to manually couple and decouple the liquid lines each time the module it is added to or removed from the system, which is not user friendly. If the liquid couplings are blind-mate liquid connectors which can automatically couple with the liquid cooling loop inside the computing device as the module is inserted into the bay, then this would solve some of the problems noted above, since the blind-mate liquid connectors do allow the module to be easily plugged and unplugged. However, blind-mate liquid connectors may suffer from other problems. For example, they pose a risk for leaking liquid into the computing system, which could damage components.

Thus, to overcome the difficulties noted above, examples described herein provide a user-friendly and leak-free liquid cooling solution for cooling pluggable modules without requiring blind-mate liquid connectors. The example systems described herein include liquid-cooled cold plates that are fixed inside bays of the system that receive the pluggable modules. Each cold plate is held by a rotating support above the spot where a pluggable module would be located when the module is installed, and is connected to a liquid cooling loop of the system. The rotating support is connected to an engagement mechanism that, when actuated, causes the rotating support to pivot downward or upward (depending on which way the engagement mechanism is actuated). In particular, actuating the engagement mechanism when the pluggable module is in the bay causes the cold plate to move into contact with a thermal interface of the pluggable module, thereby enabling the cold plate to cool the module. Similarly, actuating the engagement mechanism in an opposite direction causes the cold plate to disengage from the pluggable module so that the module can be removed from the system.

In some example systems disclosed herein, the actuating of the engagement mechanism to engage the cold plate occurs completely automatically in response to the insertion of the pluggable module, and the actuating of the engagement mechanism to disengage the cold plate requires only a simple eject command (e.g., button push). For example, the engagement mechanism may include an electronic actuator that automatically actuates the engagement mechanism in the manner noted above.

In some example systems disclosed herein, the user may manually actuate the engagement mechanism. For example, the engagement mechanism may include a lever that a user can manually move to actuate the engagement mechanism.

Thus, in examples disclosed herein, the cold plate is engaged with and disengaged from the pluggable module by way of a simple and quick process, which is essentially transparent to the user (aside from the user performing a simple step of manually actuating a lever or button in some cases). Thus, these examples are extremely user friendly, as they add only minimal and easy user operations to the process of inserting/removing a module. This is in contrast to the approach described above of installing/uninstalling the cold plate on the module with each insertion/removal of the module, which may be a slow and complex process that may require the user to have access to an interior of the chassis and technical knowledge.

In some examples, multiple cold plates for multiple bays may be ganged together such that actuation of the engagement mechanism causes all of the cold plates to engage or disengage from the pluggable modules in their respective bays. This may further simplify the process of engaging the cold plates, as a user need only perform an operation to actuate the engagement mechanism once to enable engagement/disengagement of multiple cold plates.

Additional advantageous features of the example computing devices and cold plate assemblies will be described in greater detail below with reference to certain detailed implementation examples. It should be understood that the implementation examples described below are merely some examples of how the computing devices and cold plate assemblies could be implemented, and that other examples of the computing devices and cold plate assemblies could omit some of the features described below and/or could include additional features not described below. Moreover, it should be understood that features described in relation to one implementation example could be included in another implementation example even if that particular combination is not explicitly shown or described.

1. EXAMPLE COMPUTING DEVICE WITH COLD PLATE ASSEMBLY

An example computing device 1 will now be described with reference to FIGS. 1-16B. Because certain features are visible in many of the figures, to avoid duplicative description, the figures will not each be described separately in the order they appear. Instead, the features will be described without regard to the ordering of the figures, and when a particular figure is relevant to the feature being described it will be identified parenthetically. The identification of one figure as relevant to a feature does not imply that other figures are not also relevant to that feature, or that the feature is somehow limited to the example illustrated in the identified figure.

Figure 9:
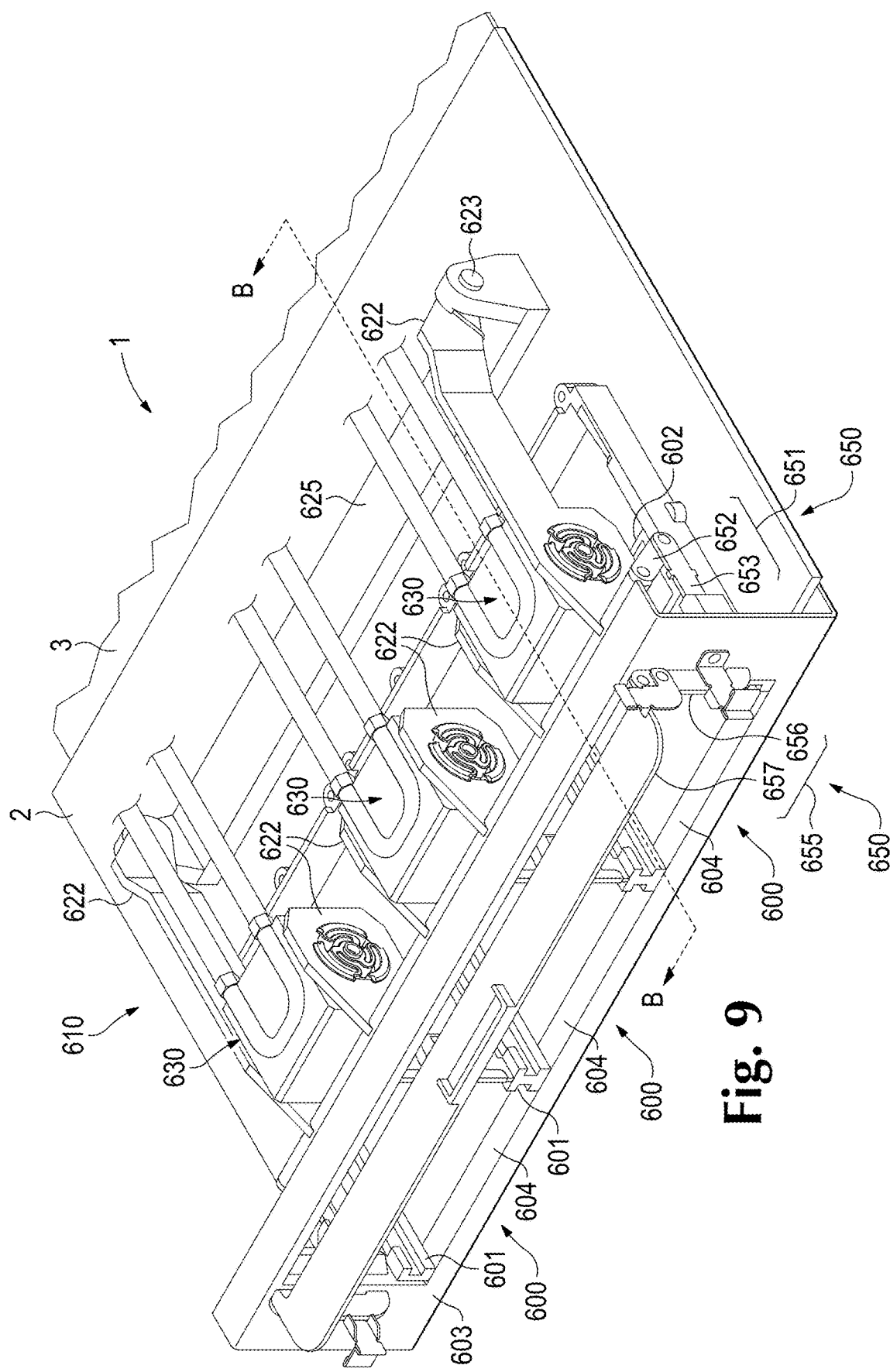
FIG. 9 is a perspective view of an example computing device with a second example cold plate assembly.

The computing system 1 includes a system board 2 housed within a chassis 3, and one or more bays 600 that each are to receive a pluggable module 700 (see FIGS. 1 and 9). The computing system 1 also includes a cold plate assembly 610 that includes one or more liquid-cooled cold plates 630 (also referred to as "cold plate 630"), each associated with one of the bays 600 (see FIGS. 1 and 9).

The cold plates 630 are supported by a pivoting support 621, which can pivot (rotate) relative to the system board 2 such that the cold plates 630 move up and down. The cold plate assembly 610 also includes an engagement mechanism 650 that, when actuated, rotates the pivoting support 621, causing the cold plates 630 to engage with or disengage from their corresponding pluggable modules 700 (see FIGS. 1 and 9).

These features will be described in greater detail below in sections 1.1 through 1.5. Features that are common to many implementation examples are described below in sections 1.1 and 1.2. Certain differences between some implementation examples will be described in sections 1.4 and 1.5.

1.1. System Board, Chassis, and Bays

The system board 2 includes a printed circuit board with one or more computer components (not illustrated), such as a processor, memory, switch, etc., attached thereto. The system board 2 may also be referred to as a motherboard, a node board, a printed circuit board (PCB), a printed circuit assembly (PCA), etc.

The chassis 3 is a rigid structure (e.g., sheet metal) that is to support the system board and, in some examples, enclose and protect the system board 2 (see FIGS. 1 and 9). The chassis 3 may also be referred to as a server tray, a housing, etc. The chassis 3 may have any desired shape and configuration, such as a tray, box, etc. Although only a bottom wall and one side wall of the chassis 3 are illustrated in the figures to avoid obscuring details, the chassis 3 may also have a top wall (lid) and additional side walls.

The bay 600 includes structures that define a region within the computing system that can receive a pluggable module 700. In particular, the bay 600 may include a bay entrance 603, which is a structure separating an interior of the chassis 3 from an exterior of the chassis 3, and which includes an opening 604 through which the pluggable modules 700 may be inserted into the bay 600 (see FIGS. 1 and 9). In the examples illustrated in the figures, the bay entrance 604 is one of the walls of the chassis 3, but in other examples it could be a separate structure. The bay 600 may also include alignment members 601, such as guide rails, groves, slots, tabs, and the like, which engage with the pluggable module 700 to constrain its movement to guide it into a desired position as the pluggable module 700 is inserted into the bay 600 (see FIGS. 1 and 9). The alignment members 601 may include a pin guide 605, which guides a locking pin 627.

The bay 600 also includes an electrical connector 602 to electrically connect the pluggable module 700 to the system board 2 (see FIGS. 1 and 9). The connector 602 may be any type of electrical connector. In some examples (see FIGS. 1-6), the electrical connector 602 is configured to mate with an electrical connector 724 that is an edge connector. In some examples (see FIGS. 9-13), the electrical connector 602 may be a land-grid-array (LGA) socket or pad array that is located below the pluggable module 700, and which engages contacts of an electrical connector 724 on a bottom of the module 700.

The figures illustrate examples of bays 600 configured to receive two specific form factors of pluggable modules 700 (described in greater detail below). However, it should be understood that the computing device 1 could also be implemented with bays 600 configured to receive any other form factor of pluggable modules 700, as long as the pluggable module 700 has a thermal interface 723 that is accessible from above by the cold plate 630. In addition, any number of bays 600 may be included in the computing device 1, and different types may be mixed within the same computing device 1.

The locations, shapes, and configurations of the alignment members 601, opening 604, and connector 602 may vary from one bay 600 to the next or from one device 1 to the next, depending on the type of module 700 the bay 600 and/or device 1 are designed to receive. One of ordinary skill in the art would understand how to modify the locations, shapes, and configurations of the alignment members 601, opening 604, and connector 602 to accommodate different form factors of modules 700.

1.2. Cold Plate Assembly

As noted above, the cold plate assembly 610 includes one or more cold plates 630, a pivoting support 621 that supports the cold plates 630, and a cold plate engagement mechanism 650 (see FIGS. 1 and 9). The cold plate assembly 610 may also include radial springs 640 to connect the cold plates 630 to the pivoting supports 621 (see FIGS. 1, and 7-9). These features will now be described in greater detail in sections 1.2.1 through 1.2.4 below.

1.2.1. Pivoting Support

The pivoting support 621 includes one or more support arms 622 to support the cold plates 630. The support arms 622 are configured such that they collectively pivot or rotate relative to the system board 2. In particular, at least one of the support arms 622 is connected at one end thereof to a hinge 623.

In some examples, there are two support arms 622 for each cold plate 630, with the support arms 630 being located on opposite sides of their corresponding cold plate 630 (see FIGS. 1 and 9). A pair of support arms 622 may be connected to their cold plate 630 via a radial spring 640 (described in greater detail in section 1.2.3 below).

Figure 10:
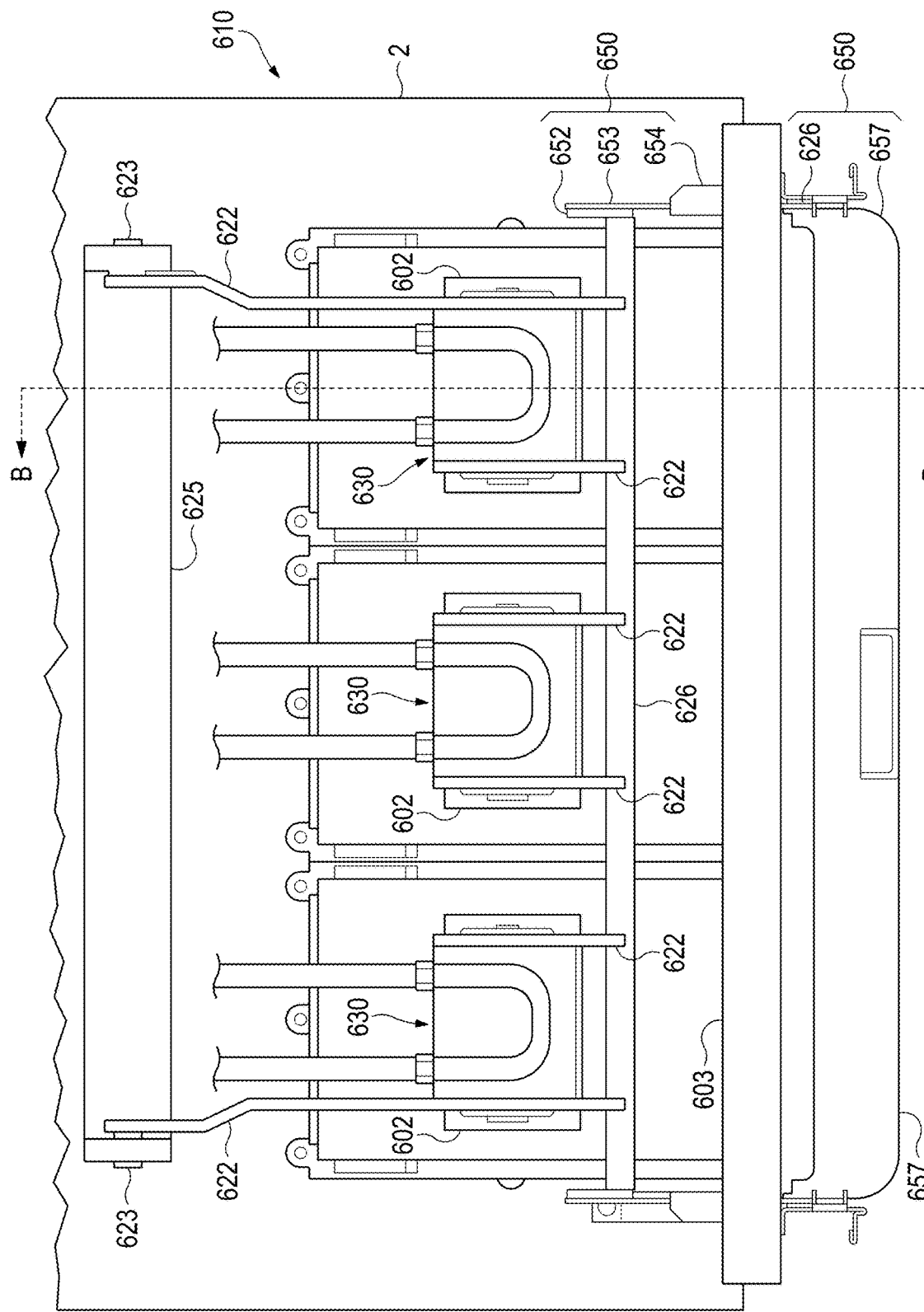
FIG. 10 is a top plan view of the example computing device of FIG. 9.

Each of the support arms 622 may have a first end that is connected to an engagement bar 626 (see FIGS. 1 and 10). Thus, all of the support arms 622 are fixed relative to one another by virtue of being connected to the same engagement bar 626.

At least one of the support arms 622 has a second end that is connected to a hinge 623, which enables the support arm 622 to pivot or rotate relative to the system board 2. In some examples, more than one of the support arms 622 may be connected to the hinge 623 (see FIGS. 1 and 10). In some examples, all of the support arms 622 may be connected to the hinge 623. In some examples, less-than-all of the support arms 622 may be connected to the hinge 623. For example, as illustrated in FIG. 10, the two outermost support arms 622 are connected to the hinge 632, while the remaining support arms 622 are shortened and are not connected to the hinge 632. Those support arms 622 that are connected to the hinge 623 constrain motion of the engagement bar 626 relative to the system board 2.

In some examples (not illustrated), multiple support arms 622 may be joined together at one end thereof, like branches diverging from a common trunk. For example, two support arms 622 that are separate at their first end (the end connected to the engagement bar 626) may join together and share the same structure at their second end (the end connected to the hinge 623), forming a "Y" like structure.

The hinge 623 may comprise a bracket 625 and pins 624. The pins 624 engage sockets in the bracket 625 and are connected to at least some of the support arms 622 such that support arms 622 can rotate relative to the system board 2. The bracket 625 may be affixed to the system board 2 (see FIGS. 1 and 9) and/or to the chassis 3 (not illustrated). In the examples illustrated in the figures, there is one bracket 625 for the entire cold plate assembly 610, but this need not necessarily be the case. For example, there could be multiple distinct brackets 625, such as one for each cold plate 630.

The engagement bar 626 is coupled to the cold plate engagement mechanism 650 (See FIGS. 1 and 9). When the engagement mechanism 650 is actuated, it exerts forces on the engagement bar 626 which are translated by the support arms 622 and the hinge 623 into a torque that cases rotation of the pivoting support 621 relative to the system board 2 (see FIGS. 3A-4C, 6A-6B, and 11A-11B). In other words, the engagement bar 626 is what the engagement mechanism 650 pushes and pulls upon to cause the pivoting support 621 to rotate. The engagement bar 626 also supports those of the support arms 622 (if any) that are not connected to the hinge 623.

The pivoting support 621 rotates between an engaged position and a disengaged position. When in the engaged position, the cold plate 630 is in contact with a thermal interface 723 in the pluggable module 700 (assuming one is installed in the bay 600), and when in the disengaged position the cold plate 630 is not in contact with the thermal interface. More precisely, when the pivoting support is in the engaged position, then the cold plate 630 is located such that it would be in contact with a thermal interface 723 of the pluggable module 700 if the module 700 were installed in the bay 600. Similarly, when the pivoting support is in the disengaged position, then the cold plate 630 is located such that it would not be in contact with a thermal interface 723 of the pluggable module 700 if the module 700 were installed in the bay 600. The disengaged position may also provide sufficient clearance between the cold plate 630 and the pluggable module 700 that the cold plate 630 does not interfere with the pluggable module 700 being inserted or removed. The thermal interface 723 may be disposed on the top surface of a device to be cooled.

In some examples, the pivoting support 621 also includes locking pins 627, which extend downward from the engagement bar 626 (see FIG. 1). The locking pins 627 lock the pluggable module 700 in place in the bay 600 when the cold plate 630 is engaged with the pluggable module 700 (see FIG. 4C), and release the pluggable module when the cold plate 630 is disengaged from the pluggable module 700 (see FIG. 4B). As the cold plate 630 moves downward the locking pins 627 may also move downward until they engage latching features of the pluggable module 700, such as the notch 712, such that the locking pins 627 prevent the pluggable module 700 from being removed. Conversely, as the cold plate 630 moves upward, the locking pins 627 also move upward until they disengaged from the latching features of the pluggable module 700, thereby releasing the module 700.

1.2.2. Cold Plate(s)

The cold plate(s) 630 may each include a main body 631 that is to thermally couple with the pluggable module 700, a liquid conduit 633 that conducts heat from the main body 631 into liquid coolant, liquid lines 634 that supply and return the liquid coolant to and from liquid conduit 633, couplings 635 that mechanically couple liquid lines 634 and liquid conduits 633, and an axial support 636 that connects the cold plate to the support arms 622 (via radial springs 640) (see FIG. 1).

The main body 631 includes a module interface 632, which is a surface of the body 631 that is to thermally couple with a thermal interface 723 of the pluggable module 700 when the cold plate is in the engaged position (see FIGS. 5A-5B and 12A-12D). The thermal interface 723 of the module 700 is a surface of an object that is thermally coupled to the heat generating component 722 of the module 700 (see FIGS. 3A and 4A). For example, the thermal interface 723 may be a surface of a heat spreader in contact with the heat-generating component 722, a surface of the heat-generating component 722 itself, etc. When the module interface 632 is thermally coupled to the thermal interface 723 of the pluggable module 700, heat generated by the heat-generating component 722 is transferred into the body 631 of the cold plate 630.

The module interface 632 may be a downward facing surface of the body 631, and may be approximately parallel to the thermal interface 723 when in the engaged position. In some examples, the module interface 632 and/or the thermal interface 723 may have a thermal interface material (TIM) disposed thereon, such that the TIM is interposed between the module interface 632 and the thermal interface 723 when they are thermally coupled. In other examples, the module interface 632 and the thermal interface 723 may have no TIM and may directly contact one another when thermally coupled.

The body 631 of the cold plate 630 is thermally conductive. For example, the body 631 may be a continuous body of a thermally conductive material, such as copper or aluminum.

The liquid conduit 633 includes thermally conductive walls that define a channel through which liquid coolant flows. The liquid conduit 633 provides a thermally conductive pathway for heat to flow from the body 631 into the liquid coolant within the conduit 633.

In some examples, the liquid conduit 633 is formed from a body that is physically distinct from the body 631, such as a copper pipe. In such examples, the liquid conduit 633 is placed in thermal contact with the body 631 so that a thermally conductive pathway exists between the body 631 and the liquid coolant (see FIGS. 1 and 5A). In some of these examples, the body 631 and/or the liquid conduit 633 may be shaped so as to conform to one another, to increase the area of surface contact between them and thereby improve the thermal interface therebetween. For example, in the figures the body 631 includes a groove that complements the round shape of the conduit 633 (see FIG. 5A). As another example (not illustrated), the conduit 633 may have a flattened bottom side to contact a flat top side of the body 631.

In other examples (not illustrated), the liquid conduit 633 is formed within and by the body 631 itself. For example, the body 631 may have a hollow channel formed within it, for example by boring hole(s) through the body 631, molding or casting the body 631 with a channel therein, etc. In these examples, the heat is conducted directly from the body 631 to the liquid coolant.

The liquid lines 634 may be part of a liquid cooling loop of the computing device. One of the liquid lines 634 may supply liquid coolant to the liquid conduit 633, while the other liquid line 634 returns liquid coolant from the liquid conduit 633. The liquid cooling loop may include additional features (not illustrated) that are well known in the art, such as pumps, heat exchangers, chillers, etc. In some examples, the liquid lines 634 are distinct from the liquid conduit 633. In such examples, the liquid lines 634 may be coupled to the liquid conduit 633 by couplings 635 (aka fittings, connectors, etc.). In other examples, the liquid lines 634 and the conduit 633 may all be parts of the same body (e.g., a pipe or tubing).

The liquid lines 634 may be configured to allow for the movement of the cold plate 630 when the pivoting support 621 rotates between the engaged and disengaged positions. For example, the liquid lines 634 may be flexible tubing, such as Norprene® tubing, rubber tubing, silicone tubing, PVC tubing, etc., which allows the movement of the cold plate by flexing.

The axial support 636 extends from both sides of the body 631 to connect the body 631 to the support arms 622 (See FIG. 1). The axial support 636 may be distinct from the body 631, in which case it may be connected to the body 631. For example, the support 636 may be one or two rod(s), bolt(s), screws, or the like that extends through a hole in the body 631 or otherwise connect to the body 631. The axial support 636 may also be an integral part of the body 631, such as two protrusions extending from the body 631. The axial support 636 connects to socket 641 of the radial spring 640.

Figure 2:
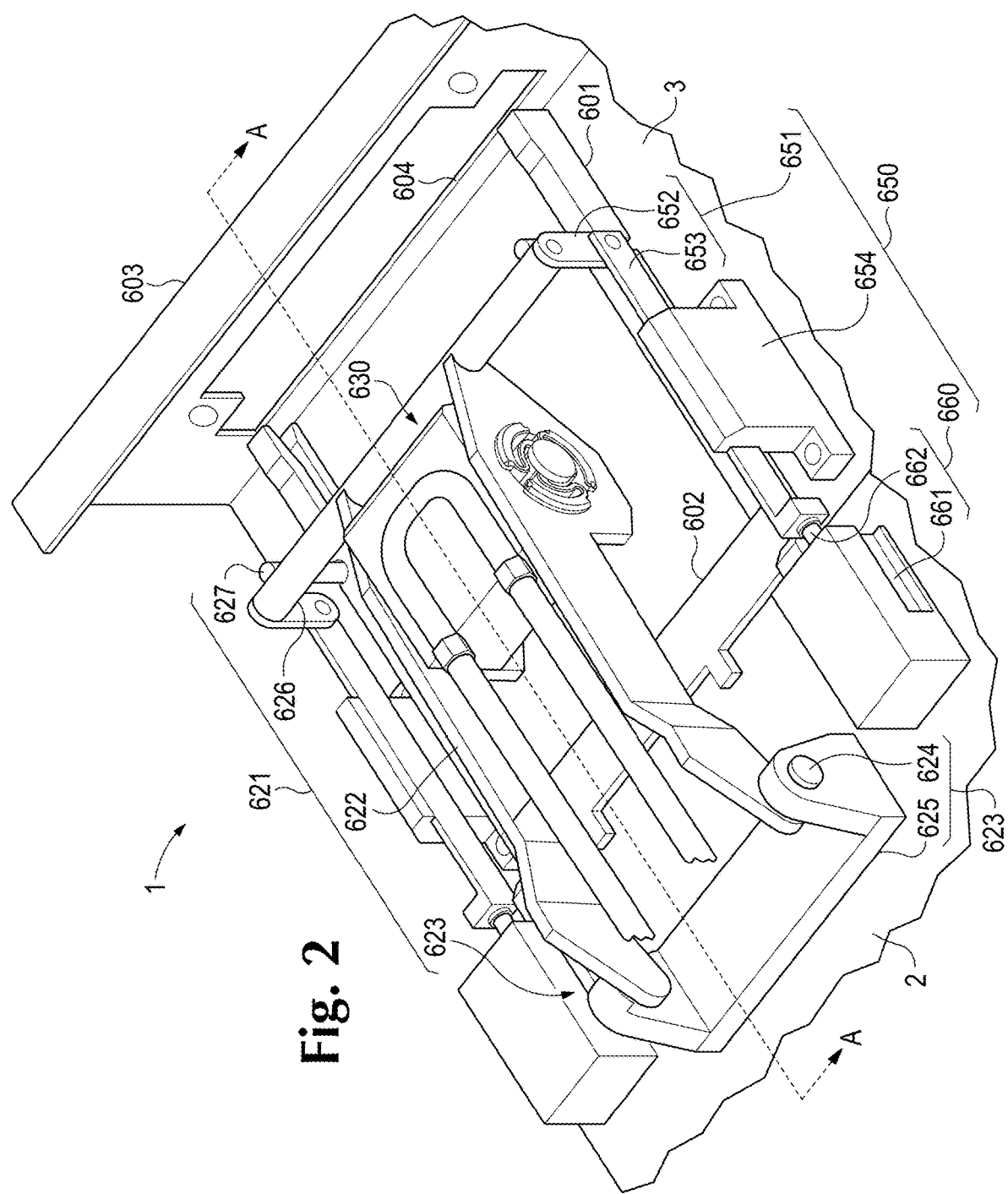
FIG. 2 is a perspective view of the example computing device of FIG. 1.

In some examples, there is only one cold plate 630 in the cold plate assembly 610, in which case the pivoting support 621 may include two support arms 622 that are both connected to the hinge 623 (see FIGS. 1 and 2).

In other examples, there are multiple cold plates 630 in the cold plate assembly 622, and the cold plates 630 may be ganged together, meaning their respective support arms 622 are all connected to the same engagement bar 626 such that the cold plates 630 all move up or down in unison (see FIG. 10). In some of these examples, not all of the support arms 622 have their second end connected to the hinge 632. For example, as illustrated in FIG. 10, the two outermost support arms 622 are connected to the hinge 632, while the remaining support arms 622 are shortened and are not connected to the hinge 632. However, in other examples (not illustrated), more than just the two outermost support arms 622 may also be connected to the hinge 632 (or to multiple hinges 632).

1.2.3. Radial Spring

The radial spring 640 is a special spring that connects the cold plate 630 to the pivoting support 621 (see FIGS. 1 and 9). The radial spring 640 includes a socket 641 in a center thereof, and multiple spring arms 642 extending from the socket 641, each ending in an engagement portion 643 that is to engage with the support arms 622 (see FIGS. 7 and 8). The spring arms 642 may include one or more bends, such that they have a serpentine or "S" shape (see FIGS. 7 and 8). The engagement portions 643 may include flanges 644, which may help to secure the radial spring 640 to the support arms 622 (see FIGS. 7 and 8). The spring may be formed form a resilient material, such as plastic, copper, spring steel, etc.

The radial spring 640 allows the cold plate 630 to translate a limited distance in two dimensions relative to the pivoting support 621. More specifically, the radial spring 640 allows the socket 641 (to which the cold plate 630 is connected) to translate relative to the engagement portions 643, a limited distance in any direction within the X-Y plane shown in FIG. 7 (the X-Y plane being fixed relative to the spring 640).

The radial spring 640 also may allow the cold plate 630 to rotate relative to the support arms 622 through a limited angle around an axis of the axial support 636. More specifically, the radial spring 640 allows the socket 641 (to which the cold plate 630 is connected) to rotate relative to the engagement portions 643 through a limited angle around a central axis of the spring 640.

The movement (translation or rotation) of the socket 641 relative to the engagement portions 643 results in the spring arms 642 elastically deforming, which generates a restoring spring force that resists the movement but allows it to occur. Thus, the socket 641 is biased towards its original location in the center of the spring 640 and its original orientation.

The fact that the radial spring 640 allows such movement and generates the opposing spring force as a result may help to ensure good thermal contact between the cold plate 630 and the pluggable module 700.

For example, when engaging the cold plate 630, the pivoting support 621 may be driven a small distance past a point at which the cold plate 630 first makes contact with the thermal interface 723 of the module 700. The spring 640 absorbs this additional movement so that the pluggable module 700 is not damaged thereby. In addition, the radial spring 640 applies a restoring spring force downward against the cold plate 630, which maintains a modest contact pressure between the cold plate 630 and the thermal interface 723, thereby improving the rate of heat transfer therebetween.

As another example, the ability of the socket 641 to rotate relative to the engagement portions 643 may help to ensure that the module interface 632 is parallel to (flush with) the thermal interface 723 of the module 700 when they are engaged, which provides optimal heat transfer rates. Because the pivoting support 621 pivots, the cold plate 630 does not move perfectly straight up or down when it is engaged/disengaged. Instead, it moves in an arc. Thus, the module interface 632 of the cold plate 630 will change orientation as the pivoting support 621 moves, and might not be exactly parallel to the thermal interface 723 when they make contact. However, if the module interface 632 is not parallel to the thermal interface 723 when they contact one another, the contact and continued driving of the pivoting support 621 will generate a torque, and because the radial spring 640 allows the cold plate 630 to rotate slightly, the torque causes the cold plate 630 to rotate until it is parallel with the thermal interface 723. Moreover, even if the module interface 632 is parallel to the thermal interface 723 when they contact one another, the continued driving of the pivoting support 621 beyond that point may cause them to cease being parallel if the cold plate 630 is not allowed to rotate at all relative to support arms 622. However, by allowing the cold plate 630 to rotate slightly, the radial spring 640 may maintain the module interface 632 parallel to the thermal interface 723 even as the pivoting support 621 continues to drive past the point of initial contact.

1.2.4. Cold Plate Engagement Mechanism

The cold plate engagement mechanism 650 includes at least one mechanical linkage 651 and associated link guide 654 (see FIGS. 1-4C and 9-11B). The mechanical linkage 651 includes a number of links, including a first link 652 and a second link 653. One end of the first link 652 is pivotally connected to the engagement bar 626 of the pivoting support 621, and the other end is pivotally connected to the second link 653. The second link 653 is held by the link guide 654, which constrains the movement of the second link 653 to one dimension (e.g., horizontal movement in the illustrated examples).

The mechanical linkage 651 is configured such that, when a force is applied to the second link 653 along a first direction aligned with its constrained dimension, this is translated into a force applied to the engagement bar 626 that biases the pivoting support 621 towards rotating downward. In other words, when the second link 653 is moved in the first direction, this causes the pivoting support 621 to rotate downward. Conversely, when a force is applied to the second link 653 along a second direction opposite to the first direction, this is translated into a force applied to the engagement bar 626 that biases the pivoting support 621 towards rotating upward. In other words, when the second link 653 is moved in the second direction, this causes the pivoting support 621 to rotate upward.

The link guide 654 may be fixed relative to the chassis 3, and may include a slot or groove which the second link 653 is inserted into to constrain the movement of the second link 653 to one dimension (i.e., along one linear axis). In the illustrated examples, the axis along which the second link 653 is constrained to move is horizontal (i.e., parallel to the bottom wall of the chassis 3), but this is merely one example and the second link 653 could be constrained to move along a different axis, such as an axis that is inclined relative to the chassis 3. In some examples, the link guide 654 is affixed to a bottom wall of the chassis 3 (see FIG. 1). In some examples, the link guide 654 is affixed to a side wall of the chassis 3 or the bay entrance 603 (see FIGS. 10-11). In other examples, the link guide 654 may be affixed to some other wall of the chassis 3, to the system board 2, or to any other object that is fixed relative to the chassis 3. The link guide 654 may be located anywhere that is convenient, as long as it can engage with the second link 653. For example, in the examples of FIGS. 1-6 the link guide 654 is located forward of the first link 652 (i.e., to the right of the first link 652 in FIGS. 4 and 6), while in the examples of FIGS. 9-13, the link guide 654 is located rearward of the first link 652 (i.e., to the left of the first link 652 in FIG. 11).

The mechanical linkage 651 may be described as having mechanical advantage, meaning that a mechanical advantage of the linkage 651 is greater than 1. The mechanical advantage of the linkage is equal to $F_1/F_2$, where $F_1$ is the force applied by the first link 652 to the engagement bar 626 in response to the horizontal force $F_2$ being applied to the second link 653. This is substantially equivalent to the value $D_2/D_1$, where $D_1$ is the distance that the engagement bar 626 moves in response to a horizontal movement of distance $D_2$ by the second link 653. For example, in the context of FIG. 5A, the mechanical advantage of the mechanical linkage 651 may equal $(d_2-d_3)/(d_1+\varepsilon)$, where $\varepsilon$ is a distance that the pivoting support 622 continues to move after initial contact between the cold plate 630 and the thermal interface 723. In some examples, the mechanical linkage 651 may be configured to have mechanical advantage greater than or equal to four.

The position of the second link 653 when the pivoting support 621 is in the engaged position may be called the engaged position of the second link 653. Similarly, the position of the second link 653 when the pivoting support 621 is in the disengaged position may be called the disengaged position of the second link 653.

Thus, the pivoting support 621 can be caused to move between the engaged position and the disengaged position by moving the second link 653 of the mechanical linkage 651 between its engaged and disengaged positions. Accordingly, actuating the engagement mechanism 650 means moving the second link 653 of the mechanical linkage 651, actuating the engagement mechanism 650 to engage the cold plate 630 means moving the second link 653 into its engaged position, and actuating the engagement mechanism 650 to disengage the cold plate 630 means moving the second link 653 into its disengaged position.

Although one mechanical linkage 651 is described above for simplicity, there may be more than one. For example, in FIGS. 1 and 9, there are two mechanical linkages (one on either side of the pivoting support 621).

There are a variety of ways that the engagement mechanism 650 can be actuated. For example, the engagement mechanism 650 may be automatically actuated by an electronic actuator, or it may be manually actuated by a user. Some specific examples of different approaches to actuating the engagement mechanism 150 are described in greater detail below in sections 1.3 and 1.4.

1.3. Engagement Mechanism with Electronic Actuator

In one example, an electronic actuator 660 may be coupled to the mechanical linkage 651 to cause the second link 653 to move between the engaged and disengaged positions (See FIGS. 1-6B). The electronic actuator 660 may be any electronic device that is capable of generating linear movement of the second link 653.

The electronic actuator 660 may be fixed relative to the pivoting support 621. For example, the electronic actuator may be affixed to the system board 2 (see FIGS. 1-6), or to any wall of the chassis 3, or to some other object (e.g., another board) that is fixed to the system board 2 or chassis. Although the actuator 660 is shown as being forward of the mechanical linkage 651 in FIGS. 1-6, in other examples the actuator 660 could be located rearward of the mechanical linkage 651.

For example, the actuator 660 may include a solenoid 661, which includes a coil (not visible) surrounding a plunger 662 (aka armature) (see FIGS. 1-5B). A current is passed through the coil, generating a magnetic field that moves the plunger 662 transversely relative to the coil. The solenoid 661 may be a latching solenoid, which latches the plunger 662 in certain positions, or a constant current solenoid. The solenoid 661 may be controlled by simple logic that moves the plunger 662 between two predetermined positions responsive to actuation signals. An advantage of a latching solenoid is that it draws power only during actuation, as the plunger 662 is latched in position rather than needing to be held in position by constantly applying the magnetic field.

Figure 6A:
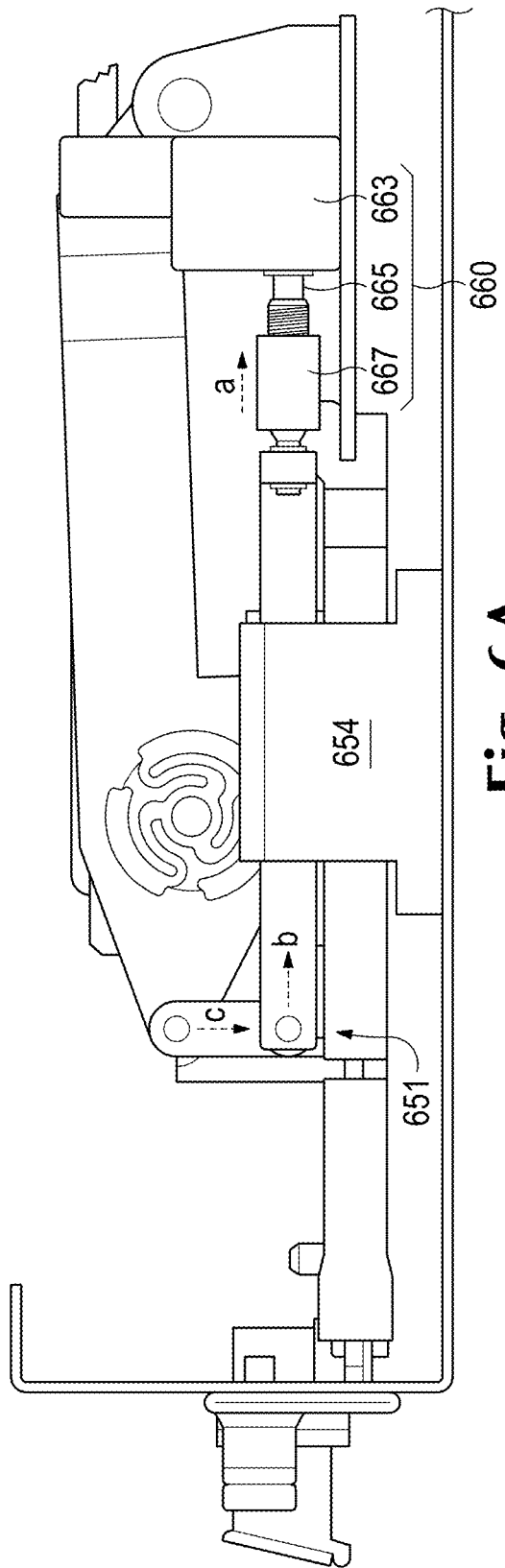
FIG. 6A-B are plan side views of a variation of the example computing device of FIG. 1 in which the electronic actuator is a rotary electric motor, and illustrate a sequence of events associated with installing a pluggable module in a bay.
Figure 6B:
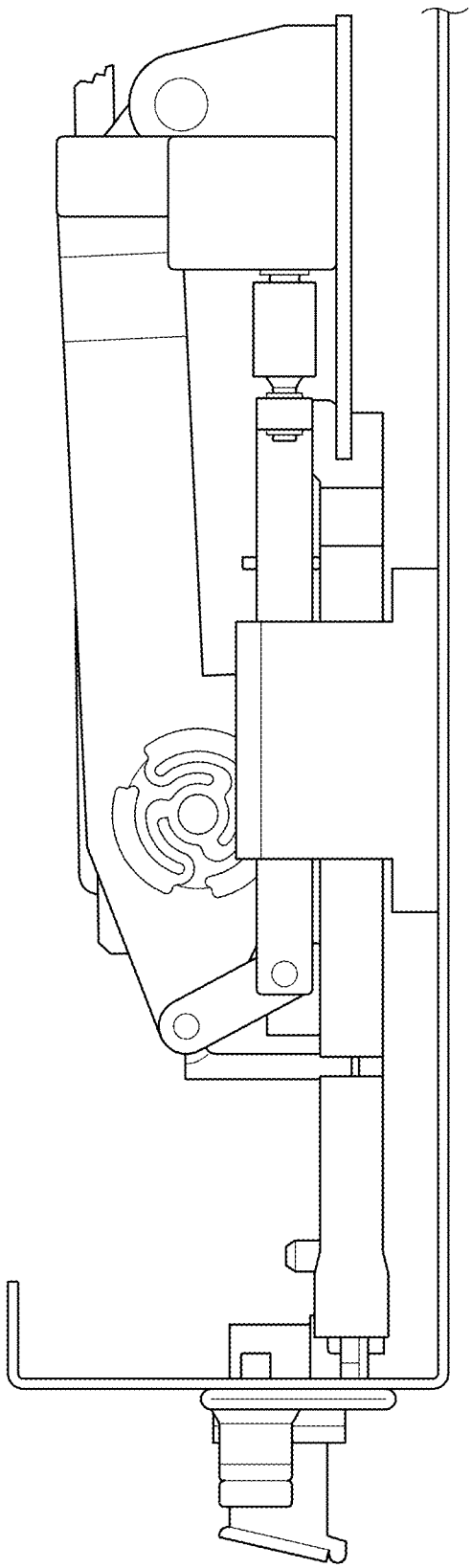
Figure 7:
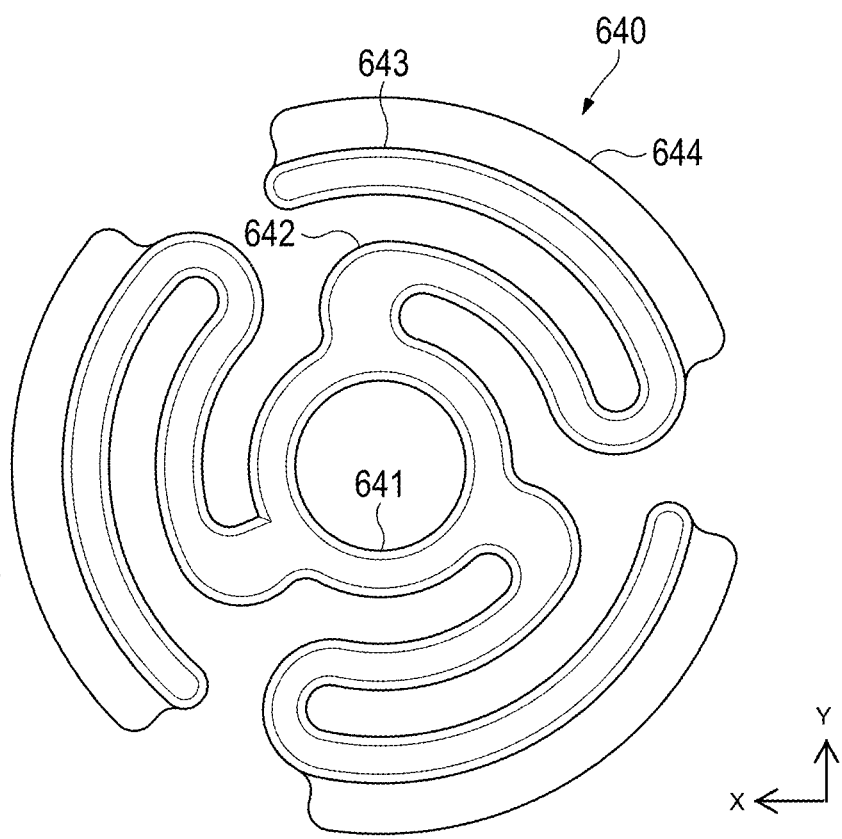
FIG. 7 is a front plan view of an example radial spring.
Figure 8:
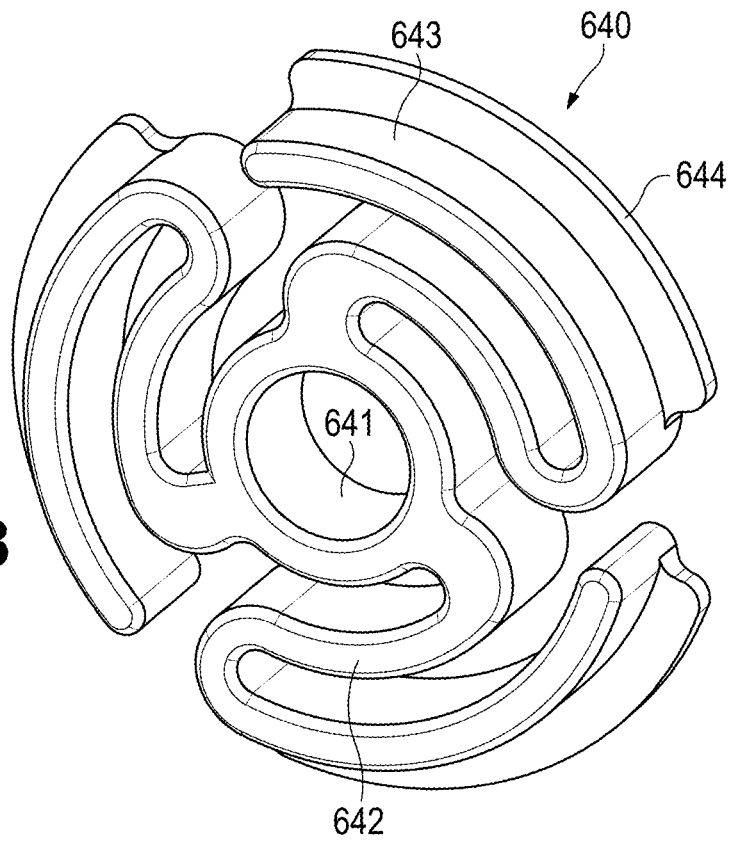
FIG. 8 is a perspective view of the example radial spring of FIG. 7.

As another example, the actuator 660 may include a rotary electric motor 663 that drives a rotating shaft 665 (aka rotor) and a gear assembly that converts the rotational movement of the shaft 665 into translational movement (see FIGS. 6A-6B). For example, the gear assembly may include threading on the shaft 665, as well as a linkage 667 with complementary threading to engage with the threading on the shaft 665 (see FIG. 6A). The rotary electric motor 663 may be controlled by open-loop or closed-loop control methods. For example, in an open-loop control method a controller (e.g., the control circuitry 800) may drive mechanical linkage 651 to a pre-programmed position that corresponds to the cold plate 630 being in up or down position. In a closed-loop control method, a controller (e.g., the control circuitry 800) may rely on a sensor that detects a position of the shaft 665, linkage 667, or mechanical linkage 651, and turn on or off the motor 663 based on this position. Alternatively, the sensor could detect current in the motor 663 indicating a level of force applied by the mechanical linkage 651.

Although the second link 653 is illustrated and described above as being a distinct part form the plunger 662 and the linkage 667, in some examples the second link 653 and plunger 662 or linkage 667 could be integrally connected parts of the same continuous body.

In some examples, the electronic actuator 660 may automatically move the second link 653 to the engaged position in response to the pluggable module 700 being installed in the bay 600. For example, when the pluggable module 700 is electrically connected to the connector 602, this may result in an electronic signal being generated that controls the actuator 660 to actuate the engagement mechanism 650. Thus, in such examples, a user does not need to take any special action beyond inserting the module 700 to actuate the cold plate engagement mechanism 650.

For example, the signal may be generated by control circuitry 800, which determines whether the module 700 is installed and controls the actuator 660 based on this. The control circuitry 800 may include one or more of, for example, a baseboard management controller (BMC) of the system board 2, a dedicated controller for the actuator 660, an operating system or other program executed by a processor of the system board 2, etc. Thus, operations described herein as being performed by the control circuitry 800 may not necessarily be performed by a single device—for example, a BMC may perform some operations, while a dedicated controller of the actuator 660 performs others.

In some examples, determining that the module 700 is installed may include more than merely detecting that a module 700 is present in the bay. Examples of criteria that the control circuitry 800 may check in determining whether the module 700 is installed include whether the module is electrically connected to the connector 602, whether the module is compatible with the bay 600, whether sensors detect presence and/or full seating of the module 700, whether management operations (e.g., identifying, configuring, authenticating, etc.) have been completed, etc. In some examples, a module is considered to be installed if any one of the criteria noted above are satisfied, while in other examples multiple (or even all) of the criteria may need to be satisfied before the module 700 is considered to be installed. The control circuitry 800 may determine whether a module 700 is compatible with the bay 600 by, for example, comparing identifying information received from the module 700 with a stored table, monitoring for a particular signal or code from the module 700 during management processes, monitoring for an electrical connection being established with a particular pin in the connector 602 that only compatible modules 700 are expected to use. In some examples, compatibility may be checked for signal protocols, power/thermal support, performance level, etc. In other examples, control circuitry may allow or disallow operation of module 700 in a bay 600. For example, an encrypted code may be verified to authenticate a module 700 for economic, security or other reasons. For economic reasons, information such as approved vendors list, allocated transaction bandwidth, etc. Module 700 may be disengaged after discovering any incompatibility or an unauthenticated module.

The control circuitry 800 may detect that the module 700 is installed by, for example, monitoring signals of the electrical connector 602. The detection may be out-of-band or in-band. For example, in an out-of-band detection regime, a presence detect pin may be included in the electrical connector 602, and when the control circuitry 800 detects an electrical signal on the presence detect pin this may be treated as an indication that the module 700 is present and installed. As another example, in an in-band detection regime, the control circuitry 800 may monitor signal of the connector 602 that are used for other purposes, like management signals, configuration check signals, authentication signals, etc., and may treat a particular status of such as signal as an indication that the module 700 is present and installed.

As another example, the control circuitry 800 may monitor the output of a mechanical, optical, or magnetic presence sensor (not illustrated), which signals when the module 700 is present. This may have a draw back in that a sensor may detect an improperly seated module 700 or a module 700 that is not compatible with the bay 600 as being present, in which case actuation of the actuators 660 might be undesirable. However, this drawback may be mitigated by using mechanical keying features (e.g., in the alignment members 601 or bay entrance 603) to prevent incompatible modules 700 from being installed, and/or arranging the sensors such that they detect a presence only when a module 700 is fully seated in the bay 600. The sensors may also be used in conjunction with the monitoring of the electrical signals from the connector 602.

As another example, the signal may be generated by the electronic module 700 responsive to receiving power from the system board, and may be communicated to the actuator 660 via a pin of the connector 602 and a conductive path connected thereto, such as a wire or signal trace on the system board 2.

In some examples, the electronic actuator 660 may automatically move the second link 653 to the engaged position in response to user input. For example, a user may push a button on the module 700 or on the computing device 1 that causes an engagement command to be generated that controls the actuator 660 to actuate the engagement mechanism 650 to engage the cold plate 630.

In some examples, the electronic actuator 660 may automatically move the second link 653 to the disengaged position in response to user input. For example, a user may push an eject button 750 on the module 700 or on the computing device 1 that causes an eject command to be generated that controls the actuator 660 to actuate the engagement mechanism 650 to disengage the cold plate 630.

Although only one actuator 660 is discussed above for simplicity, there may be more than one actuator 660 in the same cold plate assembly 610. For example, there may be one actuator 660 for each of the mechanical linkages 651. For example, two actuators 660 are illustrated in the example computing device 1 shown in FIGS. 1 and 2. In examples in which there are multiple actuators 660, they may be actuated in unison.

Figure 3A:
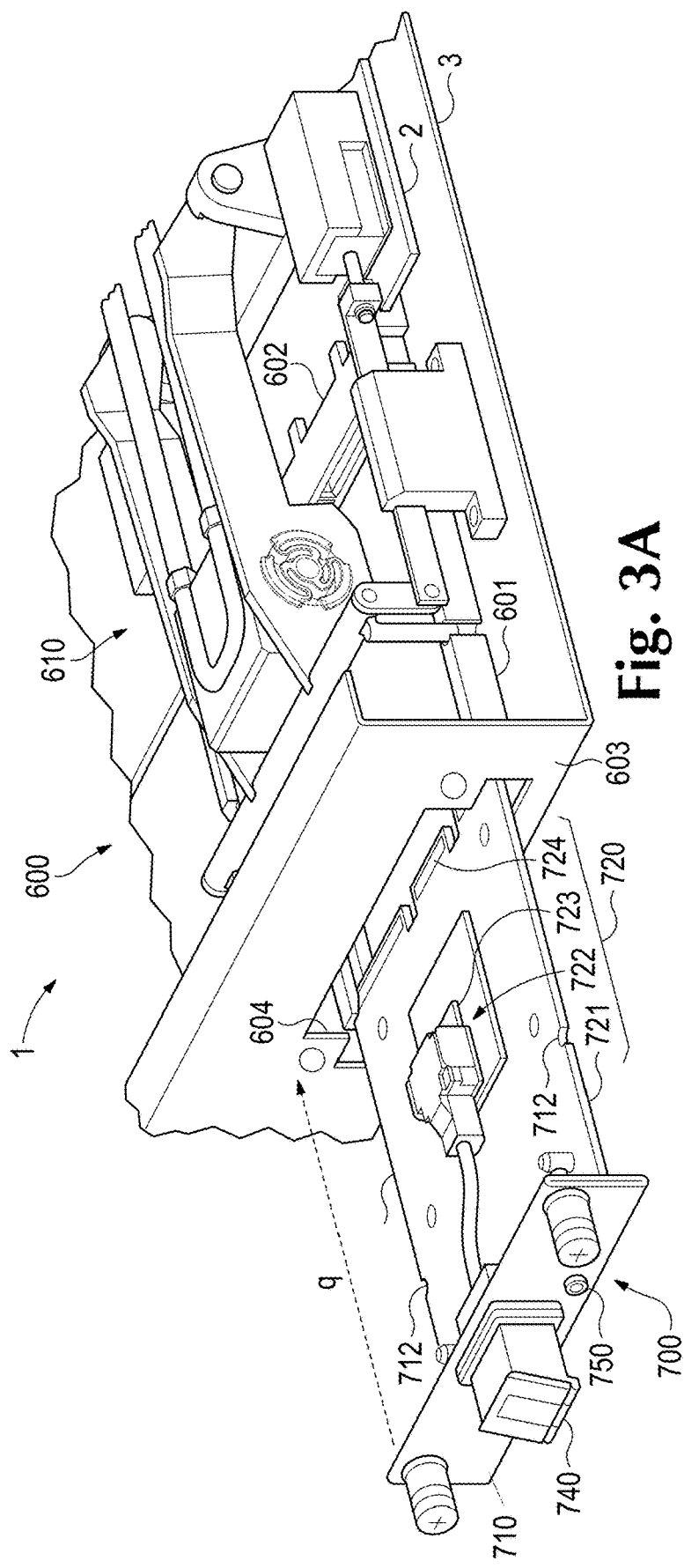
FIGS. 3A-C are perspective views of the example computing device of FIG. 1 that illustrate a sequence of events associated with installing a pluggable module in a bay.
Figure 3B:
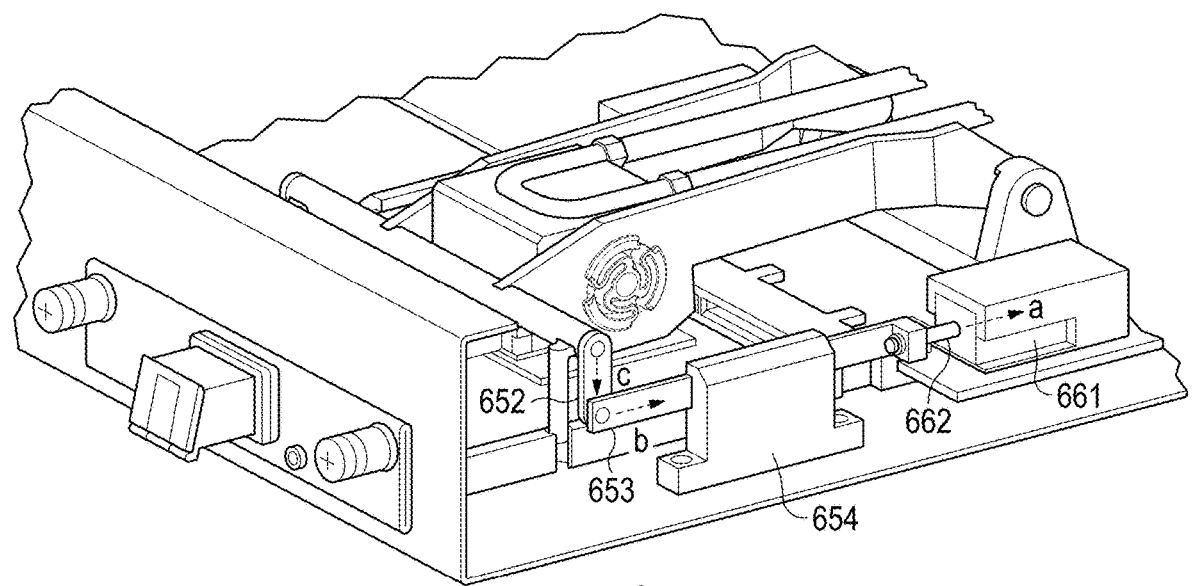
Figure 3C:
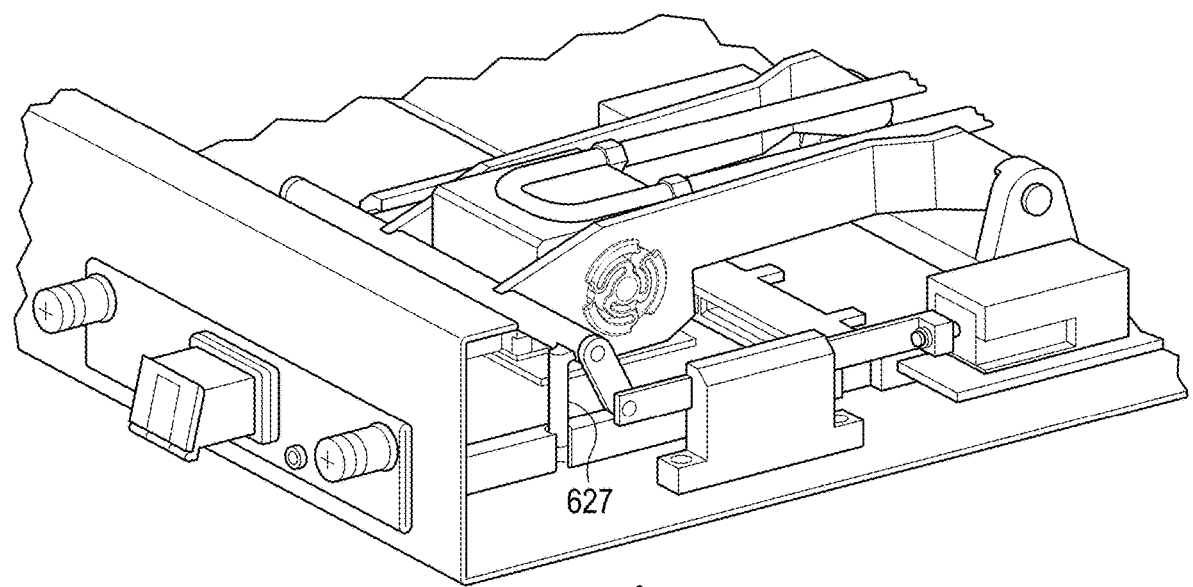
Figure 4A:
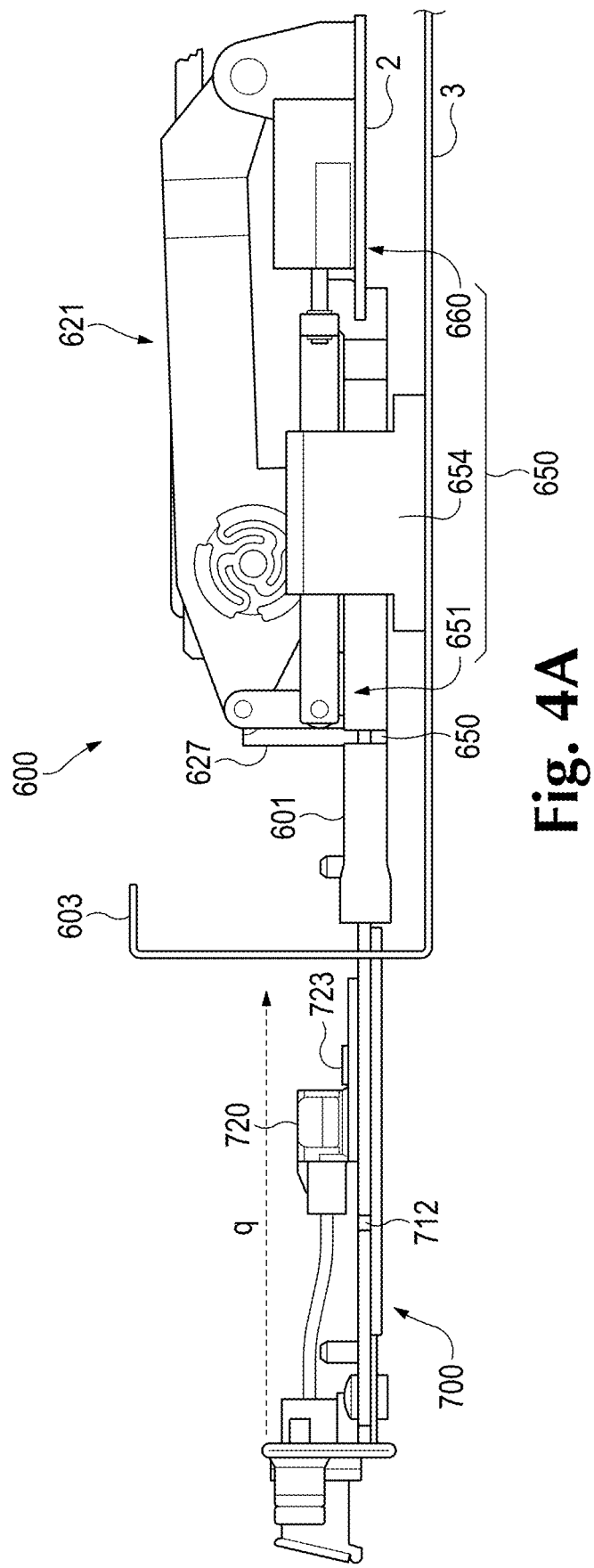
FIGS. 4A-C are plan side views of the example computing device of FIG. 1 that illustrate the sequence of events illustrated in FIGS. 3A-C.
Figure 4B:
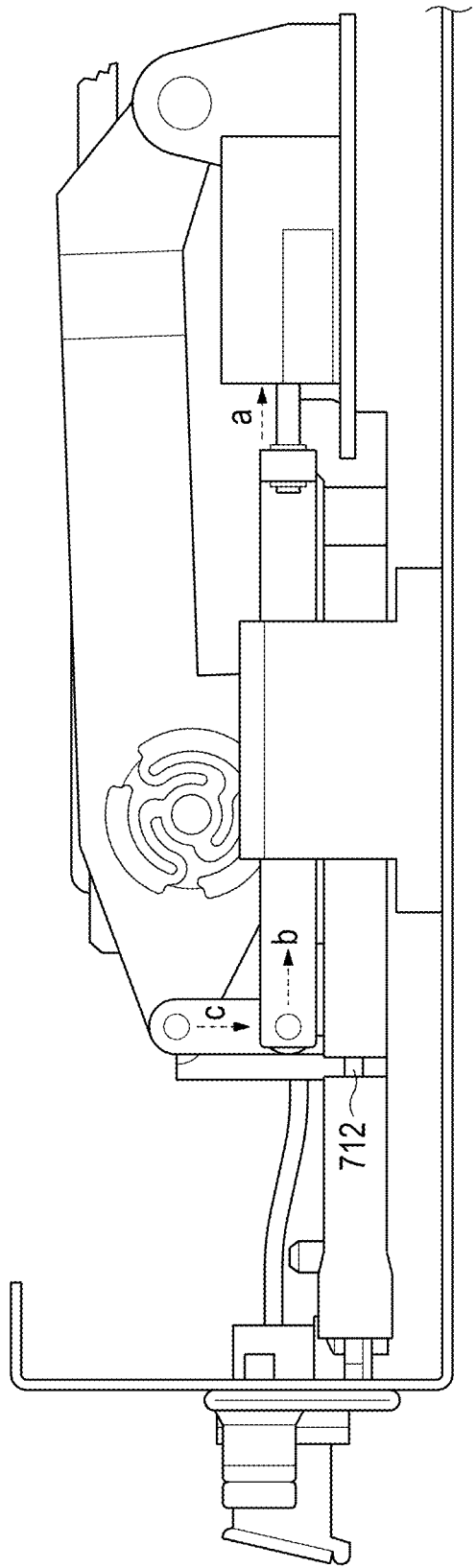
Figure 4C:
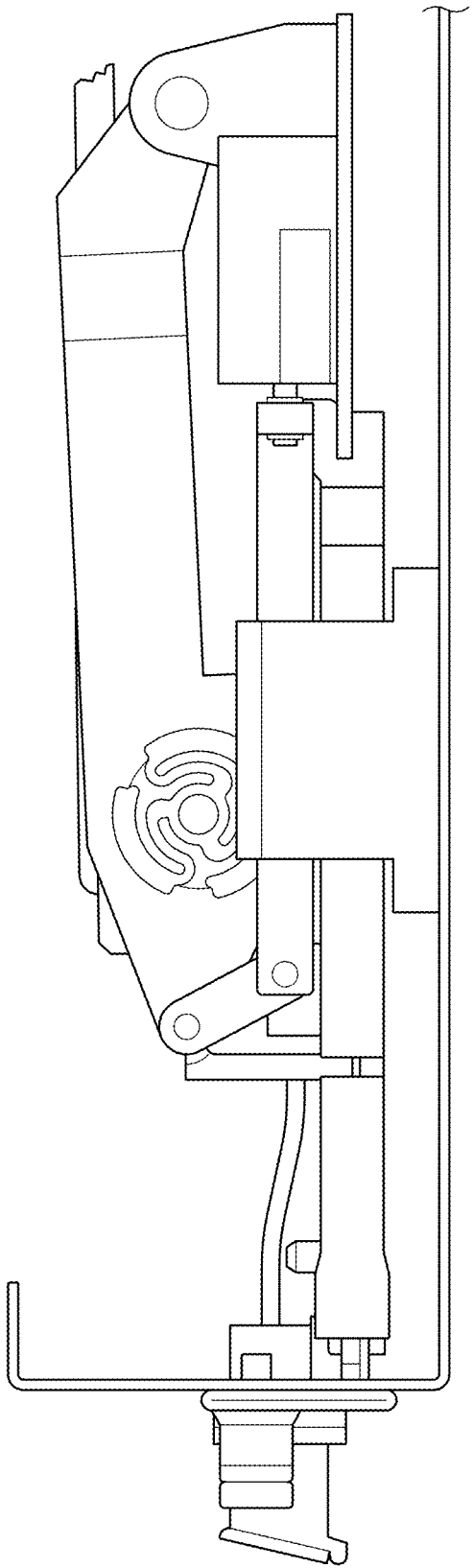

FIGS. 3A-3C, 4A-4C, and 5A-B illustrate an example sequence of installing a pluggable module 700 in which a solenoid 661 is used as the actuator 660 to actuate the cold plate engagement mechanism 650. FIGS. 3A-3C show the sequence from a perspective view and FIGS. 4A-4C show the sequence from a side view, with both focusing on the movements of the cold plate engagement mechanism 650. FIGS. 5A-B show the sequence from a cross-sectional view, highlighting the movements of the cold plate 630. Movement of parts between the figures is shown with dash-lined arrows.

First, the pluggable module 700 is inserted into the bay 600, as shown by the movement "q" in FIGS. 3A and 4A.

Once the module 700 is fully received in the bay 600 (see FIGS. 3B, 4B, and 5A), but before the engagement mechanism 650 is actuated, there is a non-zero distance $d_1$ between the module interface 632 of the cold plate 630 and the thermal interface 723 of the module 700 (See FIG. 5A). Moreover, the second link 653 is in its disengaged position, with a distance $d_2$ between the link 653 and the solenoid 661 (See FIG. 5A).

Responsive to the module 700 being installed in the bay, the solenoid actuator 660 may actuate the engagement mechanism 650 by moving the plunger 662 (movement "a" in FIGS. 3B and 4B). This causes the second link 653 to move towards its engaged position (movement "b" in FIGS. 3B and 4B), which applies a force to the engagement bar 626 that moves it downward in an arc (movement "c" in FIGS. 3B and 4B). This results in the state shown in FIGS. 3C, 4C, and 5B in which the module interface 632 of the cold plate 630 is in contact with the thermal interface 723 of the module 700. Moreover, the second link 653 is in its engaged position, with the distance $d_3$ (less than $d_2$) between the link 653 and the motor 661. In this state, the module 700 may also be locked in the bay 600 by the locking pins 627.

FIGS. 6A-6B illustrate an example sequence of installing a pluggable module 700 in which a rotary electric motor 663 is used as the actuator 660 to actuate the cold plate engagement mechanism 650. The sequence is similar to that described above with reference to FIGS. 3-5. Movement of parts between the figures is shown with dash-lined arrows.

Once the module 700 is fully received in the bay 600 (see FIG. 6A), the actuator 660 will actuate the engagement mechanism 650 by rotating the shaft 665. This causes, through interaction between the threads on the shaft 665 and the threads in the linkage 667, the linkage 667 to move towards the engaged position (movement "a" in FIG. 6A). This causes the second link 653 to move towards its engaged position (movement "b" in FIG. 6A), which applies a force to the engagement bar 626 that moves it downward in an arc (movement "c" in FIG. 6A). This results in the state shown in FIG. 6B in which the cold plate 630 is in the engaged position and is in contact with the module 700.

Although the examples illustrated in FIGS. 1-6 show the electronic actuator 660 being used in a cold plate assembly 610 having just one bay 600, it should be understood that the electronic actuator 660 could also be used in cold plate assembly 610 having multiple bays.

In some examples in which multiple bays 600 are included, the control circuitry 800 may be configured to actuate the actuators 600 responsive to some user action, such as the user pushing a button (such as the button 750), rather than automatically actuating responsive to the first module 700 being installed. This approach may be beneficial in that it allows for a user to decide how many bays 600 they want to populate with modules 700 before actuating the cold plate engagement mechanism 650. To avoid actuating the engagement mechanism 650 when there are improperly seated modules 700, or modules 700 that are not compatible with the bay 600, some examples may include presence detect sensors (not illustrated), such as optical sensors, magnetic sensors, mechanical sensors, to detect a presence of a module 700 in the bay 600 even if the module 700 is not electrically connected to the connector 602. The control circuitry 800 may then be configured to actuate the actuators 660 only if all of the modules 700 whose presence is detected by the sensors are properly installed in the bay 600, as determined from signals received from the electrical connector 602.

In some examples in which multiple bays 600 are included, the control circuitry 800 may be configured to automatically actuate the actuators 660 responsive to all of the bays 600 having a module 700 installed therein (rather than actuating as soon as one module 700 is installed). This approach may be beneficial in that it reduces the need for user-performed steps.

In some examples in which multiple bays 600 are included, the two approaches described above may both be used. Thus, if a user wishes to populate less than all of the bays 600, they may push a button or otherwise indicate when they are ready to actuate the engagement mechanism 650, but if the user populates all of the bays 600 then the engagement occurs automatically without requiring the button push or other indication.

In some examples in which multiple bays 600 are included, the control circuitry 800 does not disengage the cold plates 630 when a removal request is received to remove one module 700, since there may be other modules 700 in use at the time. In such examples, the control circuitry 800 may stop the operation of the module 700 that was requested to be removed, but not mechanically disengage the cold plates 630 or the module 700. Once all of the other modules 700 are either stopped or requested to be removed, then the control circuitry 800 may disengage the cold plates 630 and release the modules 700.

In addition, although a specific form factor of electronic module 700 is illustrated in FIGS. 1-6, any form factor of electronic module 700 could be used in connection with the cold plate assembly 610 having an electronic actuator 660. For example, the cold plate assembly 610 having an electronic actuator 660 could be used in association with a bay 600 that is designed to receive the pluggable module 700 illustrated in FIGS. 14-15, or any other type of pluggable module 700. To accommodate a different type of module 700, the dimensions of the cold plate assembly 610 may simply be modified so that the cold plate 630 is located in the proper place to make contact in the desired position on the module 700.

1.4. Engagement Mechanism with Manual Lever

In another example, a manually actuated engagement lever 655 may be coupled to the mechanical linkage 651, such that a user may manually move the engagement lever 655 to cause the second link 653 to move between the engaged and disengaged positions (see FIGS. 9-13).

The engagement lever 655 may extend outside of the bay 600 so that a user can access it (see FIG. 9). The engagement lever 655 may be shaped and configured in any way that is convenient and allows a user to actuate it. In some examples, the engagement lever 655 is configured such that the user actuates it by moving it linearly, such as horizontally (see FIGS. 11A-11B). In some examples, the engagement lever 655 may move in the same direction as the second link 653 when being actuated (see FIGS. 11A-11B). In other examples (not illustrated), the engagement lever 655 may move differently than the second link 653 when actuated—for example, the lever 655 may be rotated or moved in a different direction than the second link 653, and this movement of the lever 655 may be translated into the movement of the second link 653 by a gear assembly (not illustrated).

In the example of FIGS. 9-13, the engagement lever 655 includes two engagement lever elbows 656 which each have a bottom end connected to one of the second links 653 (see FIGS. 9 and 11A). The elbows 656 also include a top portion that extends vertically, with a bend between the top and bottom ends (see FIGS. 9 and 11A). The top ends of the elbows 656 are both connected to opposite ends of an engagement lever tab 657 and extends across the bays 600 that are serviced by of the cold plate assembly 610 (see FIGS. 9 and 10). The elbows 656 and the second links 653 may be integrally connected as the same continuous body (see FIGS. 11A-11B), or they may be separate bodies that are mechanically connected.

The engagement lever tab 657 may be able to rotate relative to the elbows 656 (See FIGS. 11A-13C). For example, the lever tab 657 may be rotated upwards to avoid interfering with the module 700 as it is installed in the bay 600 (see FIGS. 11A and 13A), and then may be rotated downwards after the modules 700 are installed to enable a user to push the engagement lever 655 towards the chassis 3 to actuate the engagement mechanism 650 (See FIGS. 11B and 13C).

The computing device 1 may include clamps 659, which may secure the engagement lever 655 in various configurations. For example, a clamp 659A may hold the lever tab 657 in a rotated-up orientation. Clamps 659B may hold the elbows 656 in a pushed-in configuration, which may maintain the cold plates 630 in engagement with the modules 700.

Figure 13A:
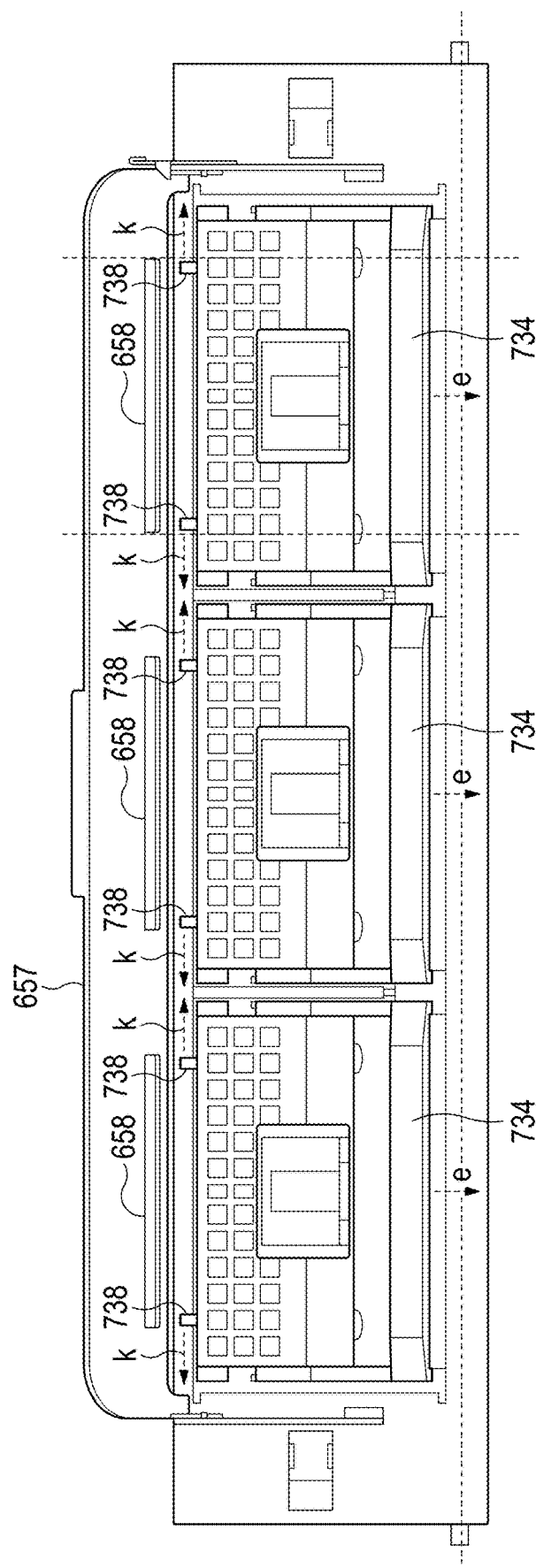

In some examples, the engagement tab 657 may include curtain tabs 658 (see FIGS. 13A-13C). The curtain tabs 658 may prevent an improper installation sequence in certain examples. For example, when the bay 600 is designed to receive the pluggable module illustrated in FIGS. 14-15B, then an electrical engagement lever 732 should be actuated before the cold plate engagement mechanism 650 is actuated, and the curtain tabs 658 help ensure that this happens.

FIGS. 11A-11B, 12A-12D, and 13A-130 illustrate an example sequence of installing a pluggable module 700 in which an engagement lever 655 actuates the cold plate engagement mechanism 650. FIGS. 11A-11B show the sequence from a side view, focusing on the movements of the cold plate engagement mechanism 650. FIGS. 12A-D show the sequence from a cross-sectional view, highlighting the movements of the cold plate 630. FIGS. 13A-C show the sequence from a front view, showing how the curtain tabs 658 interact with release tabs 738 of the module 700 to enforce a proper sequence. Movement of parts between the figures is shown with dash-lined arrows.

First, the pluggable module 700 is inserted into the bay 600, as shown by the movement "d" in FIGS. 11A and 12A, with the lever tab 657 rotated upwards as shown in FIG. 13A.

After the module 700 is fully received in the bay 600 but prior to actuating the electrical engagement lever 734 (see FIGS. 12B and 13A), the module board is 721 is a distance $d_8$ from the system board 2 such that the electrical connector 724 on a bottom side of the module board 721 is disconnected from the electrical connector 602 (see FIG. 12B). In this state, the cold plate 630 is a non-zero distance $d_5$ from the thermal interface 723 (see FIG. 12B). In addition, in this state the release tabs 738 of the pluggable module 700 are located in a non-engaged position in which they interfere with the curtain tabs 658 on the bottom side of the lever tab 657 (see FIG. 13A). This interference prevents the user from lowering the lever tab 657 and actuating the cold plate engagement mechanism 650.

Figure 12C:
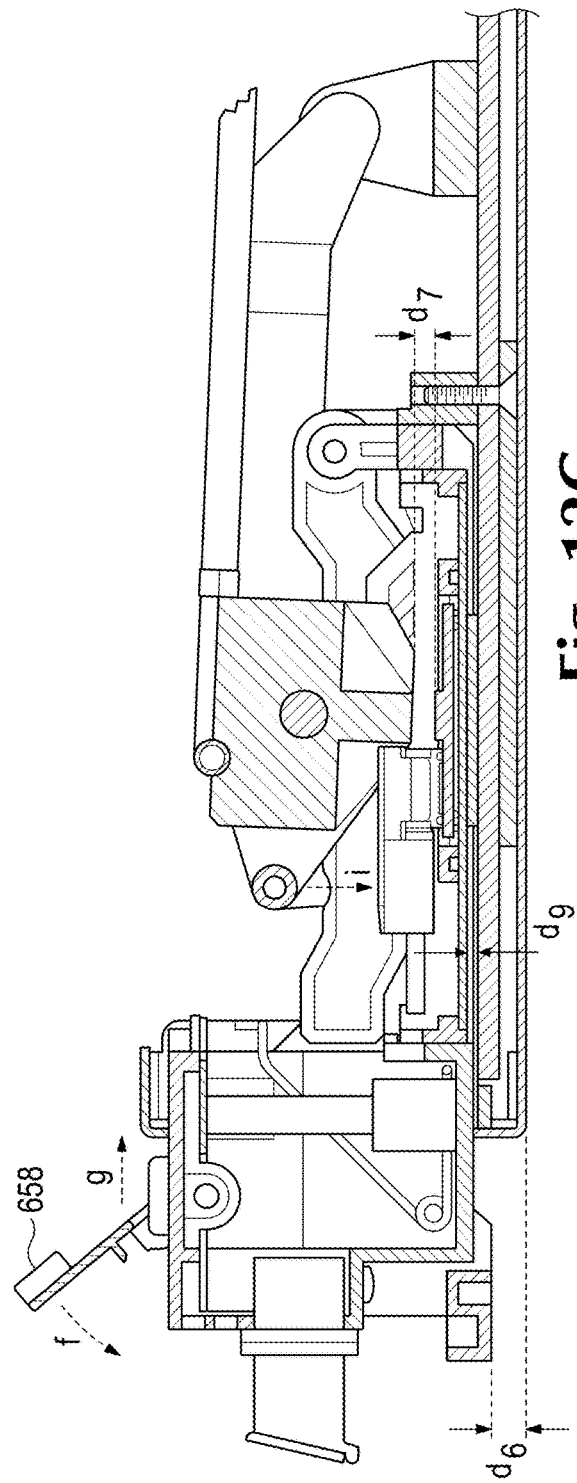
Figure 12D:
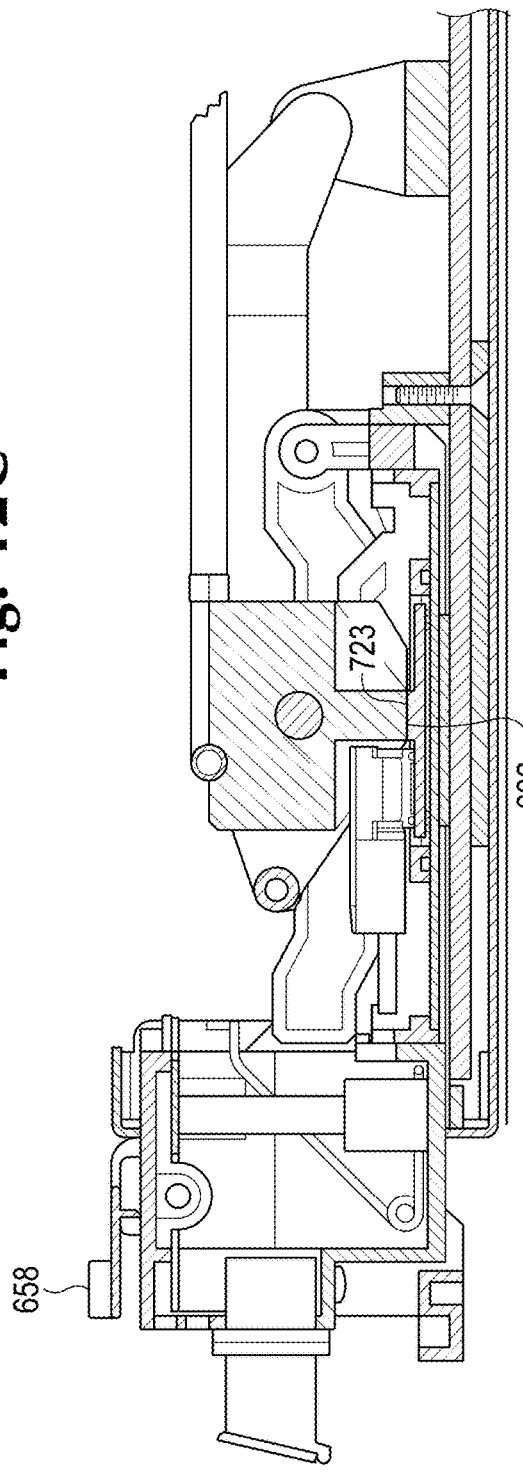

The electrical engagement lever 734 of the module 700 may then be actuated downward until the module board 721 is the distance $d_9$ (which is less than $d_8$) from the system board 2, as shown by the movement "e" in FIGS. 11A and 12B. This results in the electrical connector 724 of the module 700 connecting with the electrical connector 602. In this state, the cold plate 630 is now the distance $d_7$ (greater than $d_5$) from the thermal interface 723 (see FIG. 12B). Moreover, the actuation of the electrical engagement lever 734 causes the release tabs 738 of the module 700 to move outward, as indicated by the movement "k" in FIG. 13A. This results in the release tabs 738 ceasing to interfere with the curtain tabs 658, as illustrated in FIG. 13B. Thus, the cold plate engagement mechanism 650 may now be actuated. In particular, the lever tab 657 may be rotated downward (movement "f" in FIGS. 11A, 12C, and 13B), and then the lever tab 657 may be pushed horizontally towards the bay 600 (movement "g" in FIGS. 11A, 12C). This causes the second link 653 to move horizontally (movement "h" in FIGS. 11A, 12C), which applies a force to the engagement bar 626 that moves it downward in an arc (movement "i" in FIGS. 11A, 12C). This results in the state shown in FIGS. 11B 12D, and 13C in which the cold plate 630 is in the engaged position and is in contact with the module 700. The module 700 may also be locked in the bay 600 by the locking pins 627 in this state. The clamp 659B may hold the engagement lever 655 in this position, as illustrated in FIG. 13C.

In some examples, the electronic device 1 may include a proximity sensor (not illustrated). The proximity sensor may detect a position of the mechanical linkage 651, or some other part of the engagement mechanism 650. This information may be used by a system controller, such as a BMC or other controller, to determine whether or not to fully power on the pluggable modules 700. For example, the pluggable modules 700 may be partially powered on responsive to establishing an electrical connection with the connector 602, to enable performance of management functions like discover, configuration, authentication, etc. However, the cold pluggable modules may be prevented from being fully powered on until the cold plate engagement mechanism 650 is actuated, to prevent the modules 700 from overheating.

Figure 16A:
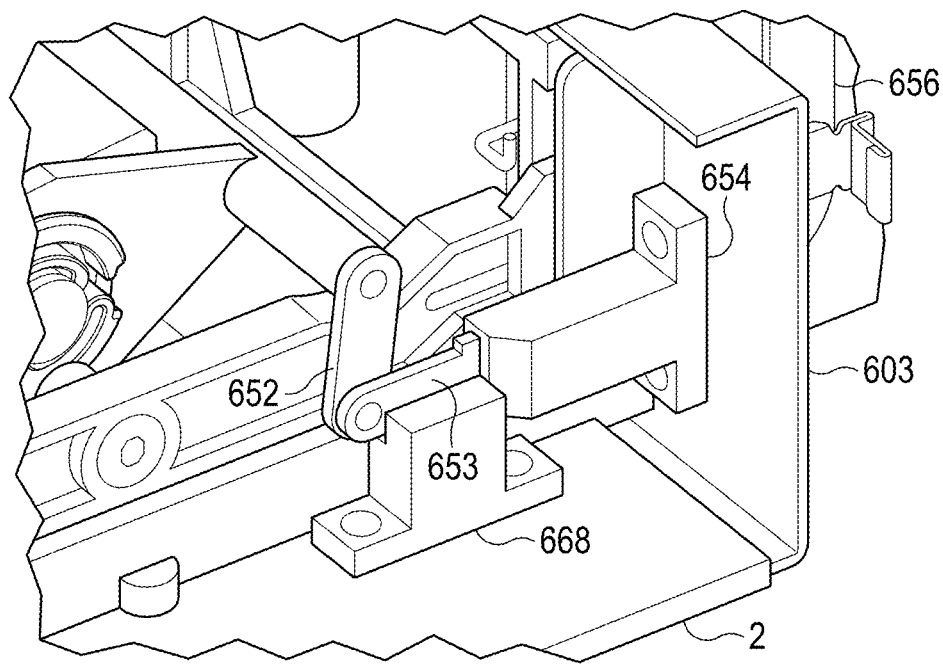
FIGS. 16A-B are perspective views of the example computing device of FIG. 9.
Figure 16B:
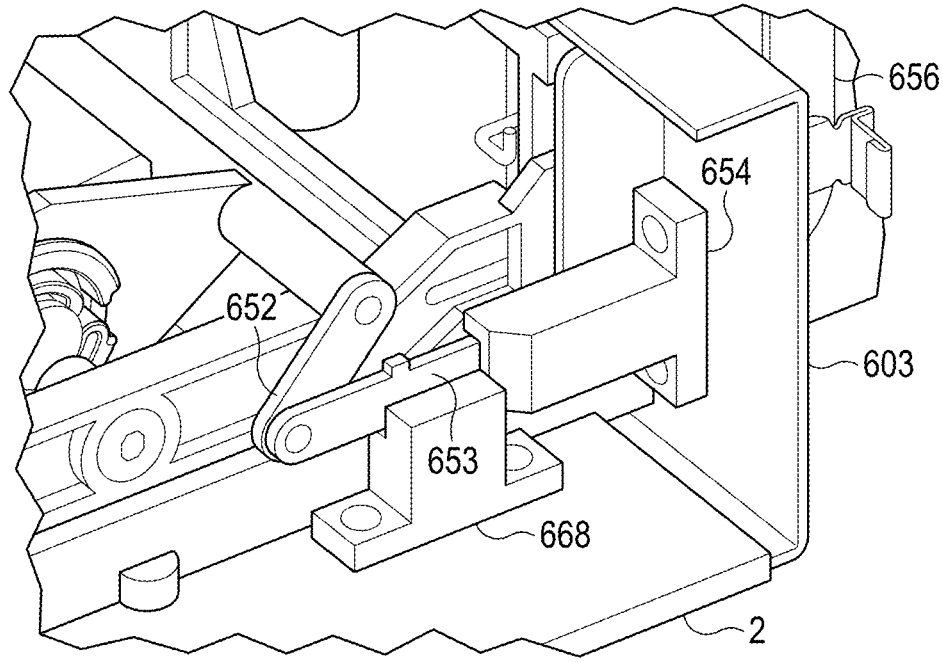

In some examples, the electronic device 1 may include an electrically actuated locking mechanism 668, as illustrated in FIGS. 16A and 16B. The locking mechanism 668 may prevent the mechanical linkage 651 from moving unless released. This may be used to prevent modules 700 from being removed from the bay 600 without the permission of the computing device 1, improving physical security. The locking mechanism 668 may also prevent actuation of the engagement lever 655 to engage the cold plate 630 until certain criteria are met. For example, the locking mechanism 668 may prevent engagement of the cold plates 630 until all of the modules 700 have been properly installed (e.g., electrically connected to the connectors 602). Control circuitry 800 may control the locking mechanism 668. The description in section 1.3 related to determining whether modules 700 have been installed is equally applicable in this context.

Although the example illustrated in FIGS. 9-15 shows the engagement lever 655 being used in a cold plate assembly 610 having multiple bays 600, it should be understood that the engagement lever 655 could also be used in cold plate assembly 610 having just one bay 600.

In addition, although a specific form factor of electronic module 700 is illustrated in FIGS. 9-13, any form factor of electronic module 700 is could be used in connection with the cold plate assembly 610 illustrated in FIGS. 9-13. For example, the cold plate assembly 610 illustrated in FIGS. 9-13 could be used in a bay 600 designed to receive the pluggable module 700 illustrated in FIGS. 3-6, or any other type of pluggable module 700. To accommodate a different type of module 700, the dimensions of the cold plate assembly 610 may simply be modified so that the cold plate 630 is located in the proper place to make contact in the desired position on the module 700.

2. EXAMPLE COMPUTING SYSTEMS

Example computing systems described herein include one of the example computing devices 1 described above, and one or more pluggable modules 700 that are installed in bays 600 of the computing devices 1.

The pluggable modules 700 may include an electric or electro-optical device 720, a carrier or housing 710 to support and/or house the electric or electro-optical device 720, and alignment members 711 to engage the alignment members 601 of the bay 600.

In some examples, the electric or electro-optical device 720 includes a module board 721 which has a heat generating component 722 formed therein or attached thereto. The heat generating component 722 may be, for example, an electro-optical transceiver, or a logic device with integrated electro-optical transceiver. A logic device may be a computing device or a network switching device. A computing device may perform functions such as general purpose computing, application-specific acceleration, security processing, machine learning, artificial intelligence, etc.

The electric or electro-optical device 720 may also include a thermal interface 723, which may be used to cool the device 720. The thermal interface 723 may be, for example, a heat spreader or other thermal transfer device in contact with the heat generating component 722. As another example, the thermal interface 723 may be, for example, a surface of the heat generating component 722 or another component of the electric or electro-optical device 720. The electric or electro-optical device 720 may also include an electrical connector 724 to connect to the connector 602 of the bay.

In some examples, the module 700 may also include one or multiple external connectors 740, which may enable connections to cables such as optical and/or electric cables. The external connectors 740 may be optically or electrically coupled to the heat generating component 722.

In some examples, the module 700 may also include an eject button 750. The eject button 750 may cause a signal to be sent to the system board 2 via the connectors 724 and 602, which may cause the cold plate assembly 610 to disengage from the module 700. The eject button 750 may also include an indicator light to indicate a status of the module 700.

A first example form factor of the pluggable module 700 is illustrated in FIG. 3A (see also FIGS. 4A and 5A-B). In this particular pluggable module 700, the carrier/housing 710 is fairly minimalistic, and includes just a faceplate. Thus, the module board 721 is mostly exposed. Moreover, the sides of the module board 721 also serve as the alignment members 712, and may include a notch 712 to engage the locking pins 627. In this example, the connector 724 is an edge connector formed on an edge of the module board 721. In the illustrated example, the heat generating component 722 is an electro-optical transceiver, but it should be understood that a similar form factor of module 700 could be used with other types of heat generating components 722.

A second example form factor for the pluggable module 700 is illustrated in FIGS. 14-15B (see also FIGS. 11A-13C). This example form factor may be referred to as a hot-pluggable line pod. In this example, the carrier/housing 710 forms a frame around a perimeter of the module board 721, while leaving a bottom of the module board 721 exposed, and the alignment members 711 extend out from the sides of the carrier/housing 710. This example module 700 also includes an electrical engagement mechanism 730, which supports the module board 721 and moves the module board 721 up and down to electrically connect the electrical connector 724 (which is located on a bottom of the module board 721) with the connector 602 (which is located below the module 700 when it is installed in the bay 600).

In the example module 700 of FIGS. 14-15B, the electrical engagement mechanism 730 includes a board support 731 which supports the board 721, an electrical engagement lever 732 which moves the board support 731 up and down, and a latch mechanism 737. The electrical engagement lever 732 includes lever arms 733 that are pivotally connected to the carrier/housing 710 by arm pivots 736. The lever arms 733 are connected to a lever tab 734 at the front of the module 700, such that moving the lever tab 734 causes the lever arms 733 to rotate upwards or downwards. The lever arms 733 are also pivotally connected to the board support 731 by board pivots 735, so that the board support 731 (and hence the module board 721) moves up and down when the lever arms 733 rotate up or down.

The latch mechanism 737 includes two release tabs 738 and two latch tabs 739 (See FIGS. 14-15B). The latch tabs 739 are biased outwards by a spring, such that when the electrical engagement lever 732 is pulled downwards to the point that the lever arms 733 drop below the latch tabs 739, the latch tabs 730 pop out and block the lever arms 733 to prevent them from moving back up. This prevents the electrical connection from being inadvertently severed. When it is desired to disconnect the module 700, the release tabs 738 may be squeezed inward simultaneously, causing the latch tabs 730 that are connected to the release tabs 738 to move out of the way of the lever arms 733, thereby enabling the lever arms 733 to be moved upward to disengage the electrical engagement mechanism 730. As noted above, the release tabs may also serve a purpose of preventing the cold plate engagement mechanism 650 from being actuated before the electrical engagement mechanism 730 is actuated.

3. EXAMPLE METHODS

One example method comprises: providing a computing device with one of the example cold plate assemblies, such as the computing device 1 described above; inserting a pluggable module, such as one of the pluggable modules 700, in a bay of the computing device; and causing the pivoting support of the cold plate assembly to move into an engaged position. The causing of the pivoting support to move into the engaged position may include manually actuating an engagement lever that is mechanically linked to the pivoting support, or causing an electronic actuator to automatically actuate an engagement mechanism.

In some examples, the method may also include manually actuating an electrical engagement lever of the module prior to causing the pivoting support of the cold plate assembly to move into an engaged position.

4. DEFINITIONS AND EXPLANATIONS

Thermal Transfer Device: As used herein, "thermal transfer device" refers to any device that is thermally conductive and that is configured to receive heat from one solid body via conduction (contact) and transfer the heat into a second solid body via conduction (contact). Examples include heat pipes, vapor chambers, heat spreaders, a solid bar or strip of metal, etc.

Heat pipe: As used herein, "heat pipe" refers to a specific type of thermal transfer device that includes a case (vessel) having walls that surround a sealed interior channel containing a working fluid and a wick such that the fluid transfers heat between different regions of the device by a cycle of vaporization and condensation.

Heat sink: As used herein, a "heat sink" is a device that receives heat from a solid body via conduction (contact) and dissipates that heat into air that flows around/through the heatsink. A heat sink is distinguished from other bodies that dissipate heat into air by the fact that the heat sink is specialized for this task, as evidenced by it including features, such as fins or pins, to increase the surface area of its portions that are in contact with the air to improve heat dissipation.

Liquid Cooled Cold Plate: As used herein, "liquid cooled cold plate" and "cold plate" refer to a device that receives heat from a solid body via conduction (contact) and dissipates that heat into liquid coolant that flows on or through the cold plate. The liquid coolant is either (a) in direct contact with the cold plate (e.g., flowing through an interior chamber of the cold plate) or (b) flowing through a pipe/tube that is in contact with the cold plate.

Thermal Interface Material (TIM): As used herein, "thermal interface material" and "TIM" refer to relatively thin, thermally conductive, and compliant (easily deformable) material placed between two devices at their thermal interface to improve heat transfer rates by filling air gaps that would otherwise occur between the devices due to surface roughness and/or misalignment. Common examples include thermal gap pads, thermal grease, and thermal paste.

Thermally couple: As used herein, to "thermally couple" two objects means to provide a thermally conductive pathway between the objects that allows heat to be conducted between the objects. Two objects may be considered to be thermally coupled if any of the following are true: (1) the two objects are in contact with one another (either direct contact, or contact via a TIM), (2) the objects are both thermally coupled to a thermal transfer device (or to a chain of thermally coupled thermal transfer devices), or (3) a heat transfer coefficient between the two objects is 10 $W \cdot m^{-2} \cdot K^{-1}$ or greater.

Thermally conductive: An object, device, or assembly (which may comprise multiple distinct bodies that are thermally coupled, and may include multiple different materials), is "thermally conductive" between two thermal interfaces if any one of the following is true: (1) a heat transfer coefficient between the thermal interfaces is 10 $W \cdot m^{-2} \cdot K^{-1}$ or greater at any temperature between 0° C. and 100° C., (2) the object is continuous piece of a material that has a thermal conductivity (often denoted k, λ, or κ) between the two interfaces of 1 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is greater than 1 $W \cdot m^{-1} \cdot K^{-1}$ between 0° C. and 100° C. include almost all metals and their alloys (e.g., copper, aluminum, gold, etc.), some plastics (e.g., TECA-COMP® TC compounds, CoolPoly® D-series Thermally Conductive Plastics), and many other materials.

Highly thermally conductive: An object, device, or assembly (which may comprise multiple distinct bodies that are thermally coupled, and may include multiple different materials), is "highly thermally conductive" between two thermal interfaces if any one of the following is true: (1) a heat transfer coefficient between the thermal interfaces is 1000 $W \cdot m^{-2} \cdot K^{-1}$ or greater at any temperature between 0° C. and 100° C., (2) the object is continuous piece of a material that has a thermal conductivity (often denoted k, λ, or κ) between the two interfaces of 100 $W \cdot m^{-1} \cdot K^{-1}$ or greater at any temperature between 0° C. and 100° C., (3) the object is a heat pipe, vapor chamber, continuous body of copper, or continuous body of aluminum. Examples of materials whose thermal conductivity is 100 $W \cdot m^{-1} \cdot K^{-1}$ or greater between 0° C. and 100° C. include certain types of copper, aluminum, silver, and gold.

Computer. As used herein, a "computer" is any electronic device that includes a processor and that is capable of executing programs comprising machine-readable instructions, including, for example, a server, a converged (or hyperconverged) appliance, a rack-scale system, some storage arrays, a personal computer, a laptop computer, a smartphone, a tablet, etc.

Provide: As used herein, to "provide" an item means to have possession of and/or control over the item. This may include, for example, forming (or assembling) some or all of the item from its constituent materials and/or, obtaining possession of and/or control over an already-formed item.

A number. Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of active optical devices, wherein the active optical devices . . . " could encompass both one active optical device and multiple active optical devices, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form and subsequent references to the item may include the definite pronoun "the" for grammatical consistency, but this does not necessarily mean that only one item is being referred to. Thus, for example, a phrase such as "an optical socket, wherein the optical socket . . . " could encompass both one optical socket and multiple optical sockets, notwithstanding the use of the singular form and the definite pronoun.

And/or. Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Nothing said herein is intended to be an admission or concession that something is prior art unless explicitly and unambiguously stated otherwise. Specifically, usage of a term such as "known", "conventional", "old", "existing", "traditional", "related art", and so on is not an indication that the thing so described is prior art—instead, these terms merely indicate that the thing so described is an alternative approach that is known to the inventors. That something is an alternative known to the inventors does not necessarily mean it qualifies as prior art, as it may be subject to a legal exception (e.g., an exception in 35 U.S.C. § 102(b)) or might not satisfy legal criteria for being considered prior art. Furthermore, the content of the background section provides context helpful to understanding the subject matter of this disclosure, but is not necessarily, and should not be assumed to be, prior art merely because it is mentioned in or associated with the background section. For example, some descriptions in the background section may refer to aspects of the subject matter of this disclosure. As another example, some descriptions in the background section may refer to items that are not prior art because they are subject to a legal exception (e.g., an exception in 35 U.S.C. § 102(b)) or otherwise do not satisfy legal criteria for being considered prior art.

Various example processes were described above, with reference to various example flow charts. In the description and in the illustrated flow charts, operations are set forth in a particular order for ease of description. However, it should be understood that some or all of the operations could be performed in different orders than those described and that some or all of the operations could be performed concurrently (i.e., in parallel).

While the above disclosure has been shown and described with reference to the foregoing examples, it should be understood that other forms, details, and implementations are contemplated and may be made without departing from the inventive concept(s) of this disclosure. While the above description contains many specifics, these should not be construed as limitations on the scope of the inventive concept(s) of this disclosure, but rather as examples of some implementations thereof. In particular, in implementing the subject matter of this disclosure in practice, one can add features that are not described herein, omit certain features that are described herein, combine features described herein in relation to one example with features described in relation to another example, modify or alter features described herein, and replace features described herein with equivalents in form and function. Such modifications of the examples described herein would be apparent to those of ordinary skill in the art having the benefit of this disclosure.

Nothing said herein should be construed as implying that any particular feature or set of features or configuration thereof is necessary or critical to the invention, unless explicitly and unambiguously indicated otherwise. Although some features may be preferred or advantageous in some circumstances, this does not mean that they cannot be omitted.

In the description above and in the figures, some well-known structures and techniques may not be described or shown in detail (or at all) so as not to obscure the disclosure. However, those of ordinary skill in the art will understand how to implement such well-known structures and techniques in practice.

5. LIST OF REFERENCE NUMBERS

U.S. patent application Ser. No. 16/175,977 (hereinafter "the parent application"), of which this is a continuation-in-part, describes some features that are similar to certain features described herein. However, different reference numbers and naming conventions may be used herein. To ease understanding, a list of features described herein and their reference numbers is provided below, with parenthetical indications of similar features described in the parent application. This list is provided merely for convenience, and is not intended to be exhaustive, and thus failure to explicitly identify a similar feature in the list below should not interpreted to mean that there is not a similar feature in the parent application.

The features are listed hierarchically, with indentations in the list indicating relationships between features, such that sub-features of a more general feature will be indented relative to and listed below the larger feature of which they are a part. However, this is done merely for ease of understanding, and should not be interpreted as limiting the claims in any way.

1 computing device (liquid-cooled transceiver assembly 100, 501)
  2 system board (system board 120, 505)
  3 chassis
  600 bay (bay 500 or receiving bay assembly 102, 503)
    601 alignment members (guide rail) (alignment members 113)
      605 pin guide
    602 electrical connector (electrical socket 114)
    603 bay entrance (bay entrance 504)
      604 opening (cavity 507)
    610 cold plate assembly
      621 pivoting support (engagement assembly 125)
        622 support arm (engagement arm 111)
        623 hinge (pivot)
        624 pins (pivot pins 118)
      625 bracket (system bracket 117)
      626 engagement bar (engagement bar 110)
      627 locking pins
      630 cold plate (heat extraction assembly 119)
        631 body (cold-plate device 112)
        632 module interface
        633 liquid conduit
        634 liquid lines (liquid line pair 116)
        635 couplings (leak proof couplings 115)
        636 axial support
      640 radial spring
        641 socket
        642 spring arms
        643 engagement portions
          644 flanges
      650 cold plate engagement mechanism
        651 mechanical linkage
          652 first link (vertical link)
          653 second link (horizontal link)
        654 link guide
        655 engagement lever
          656 engagement lever elbow
          657 engagement lever tab
        658 curtain tabs
        659 clamps
      660 actuator
        661 solenoid
        662 plunger
        664 rotary motor
        665 shaft (rotor)
        667 linkage
      668 lock
      800 control circuitry
  700 pluggable module (hot-pluggable assembly 101, 502)
    710 carrier (housing)
    711 alignment members (alignment members 122)
    712 notch 720 electric or electro-optical device
  721 module board (module board 129)
  722 heat-generating component (co-packaged assembly 124 and/or signal conversion chip 106)
  723 thermal interface
  724 electrical connector (electrical contacts)
730 electrical engagement mechanism
  731 board support
  732 electrical engagement lever (lever assembly 121)
    733 lever arms (lever arms 104)
    734 lever tab (lever bar 204)
    735 board pivots
    736 arm pivots (pivot members 130)
  737 latch mechanism
    738 release tabs (latch tabs 126
    739 latch tabs (latches 132)
740 external connector (faceplate connector 109)
750 eject button/indicator

What is claimed is:

1. A device, comprising:
a system board;
a bay to receive a pluggable module such that the pluggable module is electrically connecting to the system board; and
a cold plate assembly comprising:
  a cold plate to transfer heat to liquid coolant;
  a pivoting support that supports the cold plate and pivots relative to the system board;
  an engagement mechanism comprising a mechanical linkage with a mechanical advantage attached to the pivoting support such that moving a link of the mechanical linkage causes the pivoting support to pivot between an engaged position and a disengaged position; and
  radial springs connecting the cold plate to the pivoting support,
wherein each of the radial springs allows the cold plate to translate in two dimensions relative to the pivoting support and to rotate around an axis of the cold plate and provides a restoring spring force responsive to the cold plate moving relative to the pivoting support,
wherein, if the pivoting support is in the engaged position and the pluggable module is installed in the bay, the cold plate is in contact with a thermal interface of the pluggable module, and
if the pivoting support is in the disengaged position and the pluggable module is installed in the bay, the cold plate is not in contact with the thermal interface of the pluggable module.

2. The device of claim 1,
wherein the engagement mechanism includes an electrical actuator connected to the mechanical linkage and configured to cause the pivoting support to move between the engaged position and the disengaged position by moving the link.

3. The device of claim 2, comprising:
control circuitry configured to, responsive to the pluggable module being installed in the bay, automatically control the electrical actuator to move the pivoting support into the engaged position.

4. The device of claim 3,
wherein the control circuitry is configured to automatically detect whether the pluggable module is installed in the bay by monitoring a signal from an electrical connector of the bay.

5. The device of claim 3,
wherein the control circuitry is to, responsive to an eject request, control the electrical actuator to move the pivoting support into the disengaged position.

6. The device of claim 2,
wherein the electrical actuator includes a solenoid.

7. The device of claim 1, comprising:
a locking pin connected to the pivoting support and configured to, when the pivoting support is in the engaged position and the pluggable module is installed in the bay, engage with the pluggable module to prevent removal of the pluggable module from the bay.

8. The device of claim 1,
wherein the engagement mechanism includes an engagement lever connected to the mechanical linkage and extending outside of the bay to allow manual actuation.

9. The device of claim 8,
wherein the engagement lever includes curtain tabs to interact with tabs of the pluggable module to prevent actuation of the engagement lever if the pluggable module is in the bay and is not yet electrically engaged with an electrical connector of the bay.

10. The device of claim 1, comprising:
a second bay to receive a second pluggable module;
wherein the cold plate assembly includes a second cold plate that is connected to the pivoting support such that, when the pivoting support is in the engaged position, the second cold plate is located such that would be in contact with a thermal interface of the second pluggable module if the second pluggable module were installed in the second bay.

11. The device of claim 10,
wherein the engagement mechanism includes an engagement lever connected to the mechanical linkage and extending outside of the bay.

12. A method, comprising:
providing the device of claim 1;
inserting the pluggable module into the bay; and
causing the pivoting support move into the engaged position, wherein each of the radial springs allows the cold plate to translate in two dimensions relative to the pivoting support and to rotate around an axis of the cold plate and provides a restoring spring force responsive to the cold plate moving relative to the pivoting support.

13. A computing system, comprising:
the device of claim 1; and
the pluggable module.

14. The computing system of claim 13,
wherein the pluggable module includes an electro-optical transceiver.

* * * * *